(12) United States Patent
Li et al.

(10) Patent No.: US 12,507,539 B2
(45) Date of Patent: Dec. 23, 2025

(54) DISPLAY SUBSTRATE, MANUFACTURING METHOD THEREOF, AND DISPLAY DEVICE

(71) Applicant: BOE Technology Group Co., Ltd., Beijing (CN)

(72) Inventors: Xin Li, Beijing (CN); Xing Fan, Beijing (CN); Jing Yang, Beijing (CN); Shantao Chen, Beijing (CN); Cheng Han, Beijing (CN); Jiangnan Lu, Beijing (CN); Yansong Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 777 days.

(21) Appl. No.: 17/773,030

(22) PCT Filed: May 26, 2021

(86) PCT No.: PCT/CN2021/096130
§ 371 (c)(1),
(2) Date: Apr. 28, 2022

(87) PCT Pub. No.: WO2022/246703
PCT Pub. Date: Dec. 1, 2022

(65) Prior Publication Data
US 2024/0155904 A1 May 9, 2024

(51) Int. Cl.
*H10K 59/35* (2023.01)
*H10K 59/12* (2023.01)
(Continued)

(52) U.S. Cl.
CPC ....... *H10K 59/124* (2023.02); *H10K 59/1201* (2023.02); *H10K 59/1213* (2023.02);
(Continued)

(58) Field of Classification Search
CPC .......... H10K 59/353; H10K 59/80515; H10K 71/60; H10K 59/35; H10K 2102/3026;
(Continued)

(56) References Cited

U.S. PATENT DOCUMENTS 9,559,329 B2 * 1/2017 Lee ...................... H10K 59/122
9,614,015 B2 * 4/2017 Park ...................... H10K 59/122
(Continued)

FOREIGN PATENT DOCUMENTS

CN 102845130 A 12/2012
CN 103928626 A 7/2014
(Continued)

*Primary Examiner* — Jaehwan Oh
(74) *Attorney, Agent, or Firm* — Ling Wu; Stephen Yang; Ling and Yang Intellectual Property

(57) ABSTRACT

A display substrate comprises a base substrate that comprises a first display area provided with multiple sub-pixels of different colors. At least one sub-pixel comprises a light-emitting element and a pixel driving circuit for driving the light-emitting element to emit light. The light-emitting element comprises a first electrode, a second electrode, and an organic light-emitting layer provided between the first electrode and the second electrode. The first electrode is a reflective electrode and is electrically connected to the pixel driving circuit. A first structure is provided on a side of the first electrode of the light-emitting element of a sub-pixel of at least one target color close to the base substrate, and a surface of the first structure close to the first electrode is uneven.

19 Claims, 16 Drawing Sheets

(51) Int. Cl.
*H10K 59/121* (2023.01)
*H10K 59/124* (2023.01)
*H10K 59/80* (2023.01)
*H10K 71/60* (2023.01)

(52) U.S. Cl.
CPC ..... *H10K 59/353* (2023.02); *H10K 59/80515* (2023.02); *H10K 59/80518* (2023.02); *H10K 71/60* (2023.02); *H10K 59/873* (2023.02); *H10K 59/876* (2023.02)

(58) Field of Classification Search
CPC ........... H10K 59/1201; H10K 59/1213; H10K 59/124; H10K 59/80518
See application file for complete search history.

(56) References Cited

U.S. PATENT DOCUMENTS

| | | | |
|---|---|---|---|
| 11,917,866 B2* | 2/2024 | Yang | H10K 59/123 |
| 2013/0026461 A1 | 1/2013 | Nakamura | |
| 2015/0179946 A1 | 6/2015 | Chien et al. | |
| 2016/0254493 A1 | 9/2016 | Sun | |
| 2018/0342570 A1* | 11/2018 | Hong | H10K 59/353 |
| 2019/0047258 A1 | 2/2019 | Suematsu et al. | |
| 2019/0165318 A1* | 5/2019 | Choi | H10K 50/822 |
| 2019/0386077 A1 | 12/2019 | He et al. | |
| 2020/0058719 A1 | 2/2020 | Yeon et al. | |
| 2020/0212275 A1* | 7/2020 | Choi | H10K 59/124 |
| 2020/0373366 A1 | 11/2020 | Sim et al. | |
| 2021/0335901 A1 | 10/2021 | Hu et al. | |
| 2022/0123057 A1 | 4/2022 | Han et al. | |

FOREIGN PATENT DOCUMENTS

| | | |
|---|---|---|
| CN | 103996694 A | 8/2014 |
| CN | 104752460 A | 7/2015 |
| CN | 106373985 A | 2/2017 |
| CN | 107221553 A | 9/2017 |
| CN | 107464825 A | 12/2017 |
| CN | 208256730 U | 12/2018 |
| CN | 109616500 A | 4/2019 |
| CN | 109873088 A | 6/2019 |
| CN | 111092107 A | 5/2020 |
| CN | 111384119 A | 7/2020 |
| CN | 111969121 A | 11/2020 |
| CN | 112234086 A | 1/2021 |
| JP | 2002-8870 A | 1/2002 |
| KR | 10-2020-0021016 A | 2/2020 |
| TW | 200520604 A | 6/2005 |

* cited by examiner (a)

(b)

(c)

DISPLAY SUBSTRATE, MANUFACTURING METHOD THEREOF, AND DISPLAY DEVICE

CROSS-REFERENCE TO RELATED APPLICATION

This application is a national stage application of PCT Application No. PCT/CN2021/096130, which is filed on May 26, 2021, and entitled "Display Substrate, Manufacturing Method Thereof, and Display Device", the content of which should be regarded as being incorporated herein by reference.

TECHNICAL FIELD

The present disclosure relates to, but is not limited to, the field of display technologies, and particularly to a display substrate and a manufacturing method thereof, and a display device.

BACKGROUND

An Organic Light Emitting Diode (OLED) with advantages of ultra-thin design, large field of view, active emission, high brightness, continuous and adjustable light colors, low cost, quick response, low power consumption, wide working temperature range, flexible display, and the like, has gradually become a next-generation display technology with a broad development prospect and attracted more and more attention. The OLED may be divided into a Passive Matrix (PM) type and an Active Matrix (AM) type according to different drive modes. An AMOLED is a current-driven device and controls each sub-pixel using an independent Thin Film Transistor (TFT), and each sub-pixel may be continuously and independently driven to emit light.

SUMMARY

The following is a summary of subject matters described herein in detail. The summary is not intended to limit the scope of protection of claims.

Embodiments of the present disclosure provide a display substrate and a manufacturing method thereof, and a display device.

In one aspect, an embodiment of the present disclosure provides a display substrate including a base substrate including a first display area provided with multiple sub-pixels of different colors. At least one sub-pixel of the multiple sub-pixels of different colors includes a light-emitting element and a pixel driving circuit electrically connected to the light-emitting element. The light-emitting element includes a first electrode, a second electrode, and an organic light-emitting layer provided between the first electrode and the second electrode. The first electrode is electrically connected to the pixel driving circuit. A first structure is provided on a side of the first electrode of the light-emitting element of a sub-pixel of at least one target color close to the base substrate, and a surface of the first structure close to the first electrode is uneven.

In some exemplary embodiments, the first structure includes at least one convex structure. An orthographic projection of the first electrode on the base substrate includes an orthographic projection of the at least one convex structure on the base substrate.

In some exemplary embodiments, the first structure further includes a first insulating layer located on a side of the at least one convex structure close to the base substrate. An orthographic projection of the first insulating layer on the base substrate includes an orthographic projection of the first electrode on the base substrate.

In some exemplary embodiments, a surface of the first insulating layer close to the convex structure is flat.

In some exemplary embodiments, a surface of the first insulating layer close to the convex structure has a concave surface, and an orthographic projection of the convex structure on the base substrate does not overlap an orthographic projection of the concave surface of the first insulating layer on the base substrate.

In some exemplary embodiments, the at least one convex structure is made of a metallic material or a photosensitive organic material.

In some exemplary embodiments, the at least one convex structure is made of a metallic material, and the first structure further includes a second insulating layer between the at least one convex structure and the first electrode.

In some exemplary embodiments, the first structure has a flat portion and at least one non-flat portion. An orthographic projection of the flat portion on the base substrate does not overlap an orthographic projection of the at least one non-flat portion on the base substrate. An orthographic projection of the first electrode on the base substrate includes an orthographic projection of the at least one non-flat portion on the base substrate.

In some exemplary embodiments, the at least one non-flat portion includes at least one of a convex structure and a concave structure. A thickness of the first structure at the convex structure is greater than a thickness at the flat portion, and a thickness of the first structure at the concave structure is less than the thickness at the flat portion.

In some exemplary embodiments, in a plane perpendicular to the base substrate, the convex structure includes a top surface and a slope surface connecting to the top surface, and an angle between a tangent of the slope surface and a plane parallel to the base substrate is about 3° to 30°.

In some exemplary embodiments, the convex structure has a height of about 100 nm to m.

In some exemplary embodiments, in a plane parallel to the base substrate, a length of the convex structure in a first direction is less than a length of the corresponding sub-pixel in the first direction, and the length of the convex structure in a second direction is less than a length of the corresponding sub-pixel in the second direction. The first direction crosses the second direction.

In some exemplary embodiments, in a plane parallel to the base substrate, the convex structure has a width of about 500 nm to 15 μm, and a non-planar structure formed by the first electrode based on the convex structure has a width of about 1 μm to 25 μm.

In some exemplary embodiments, a shape of the non-planar structure formed by the first electrode based on the first structure is different from a shape of the base substrate.

In some exemplary embodiments, the first electrode is a reflective electrode.

In some exemplary embodiments, the sub-pixel of at least one target color includes at least one of a blue sub-pixel, a green sub-pixel, and a red sub-pixel.

In some exemplary embodiments, the pixel driving circuit includes an active layer, a first gate metal layer, a second gate metal layer, a first source-drain metal layer, and a second source-drain metal layer that are sequentially provided on the base substrate. The first structure is located between the second source-drain metal layer and the light-emitting element, and a thickness of the first structure is less than or equal to 2 μm. The first source-drain metal layer and the second source-drain metal layer satisfy at least one of the following: an overlapping area of an orthographic projection of the first source-drain metal layer and the second source-drain metal layer of the pixel driving circuit of the sub-pixel of at least one target color on the base substrate is greater than an overlapping area of a projection of the first source-drain metal layer and the second source-drain metal layer of the pixel driving circuit of a sub-pixel of a color other than the at least one target color; and a thickness of the second source-drain metal layer of the pixel driving circuit of the sub-pixel of at least one target color is greater than a thickness of the second source-drain metal layer of the pixel driving circuit of the sub-pixel of the color other than the at least one target color.

In some exemplary embodiments, the base substrate further includes a second display area. The second display area is a flat surface display area, and the first display area is a curved display area or a bent display area around the second display area.

In some exemplary embodiments, the second electrodes of the first and second display areas are integrated, and the insulating layers of the first and second display areas are integrated.

In another aspect, an embodiment of the present disclosure provides a display device, including the aforementioned display substrate.

In another aspect, an embodiment of the present disclosure provides a manufacturing method of a display substrate, including forming multiple sub-pixels of different colors in a first display area of a base substrate, wherein at least one sub-pixel of the multiple sub-pixels of different colors includes a light-emitting element and a pixel driving circuit electrically connected to the light-emitting element, the light-emitting element includes a first electrode, a second electrode, and an organic light-emitting layer provided between the first electrode and the second electrode, the first electrode being electrically connected to the pixel driving circuit; and forming a first structure on a side of the first electrode of the light-emitting element of a sub-pixel of at least one target color close to the base substrate, a surface of the first structure close to the first electrode being uneven.

In some exemplary embodiments, the step of forming the multiple sub-pixels of different colors in the first display area of the base substrate includes forming multiple pixel driving circuits on the base substrate; and forming a first structure on a side of a first electrode of a light-emitting element of a sub-pixel of at least one target color close to the base substrate, wherein a surface of the first structure close to the first electrode is uneven. The first structure includes at least one convex structure. An orthographic projection of the first electrode on the base substrate includes an orthographic projection of the at least one convex structure on the base substrate.

In some exemplary embodiments, the step of forming the first structure on the side of the first electrode of the light-emitting element of the sub-pixel of at least one target color close to the base substrate includes at least one of the following: etching a metal film using a wet etching process to form a convex structure of the first structure; and using a photosensitive organic material for exposure and development to form a convex structure of the first structure.

Other aspects may be understood upon reading and understanding of the accompanying drawings and detailed descriptions.

BRIEF DESCRIPTION OF DRAWINGS

The drawings provide a further understanding to the technical solutions of the present disclosure, form a part of the specification, and are adopted to explain, together with the embodiments of the present disclosure, the technical solutions of the present disclosure and not intended to form limits to the technical solutions of the present disclosure. The shapes and sizes of one or more components in the drawings do not reflect the true scale, and are only intended to schematically describe the contents of the present disclosure.

DETAILED DESCRIPTION

Figure 1:
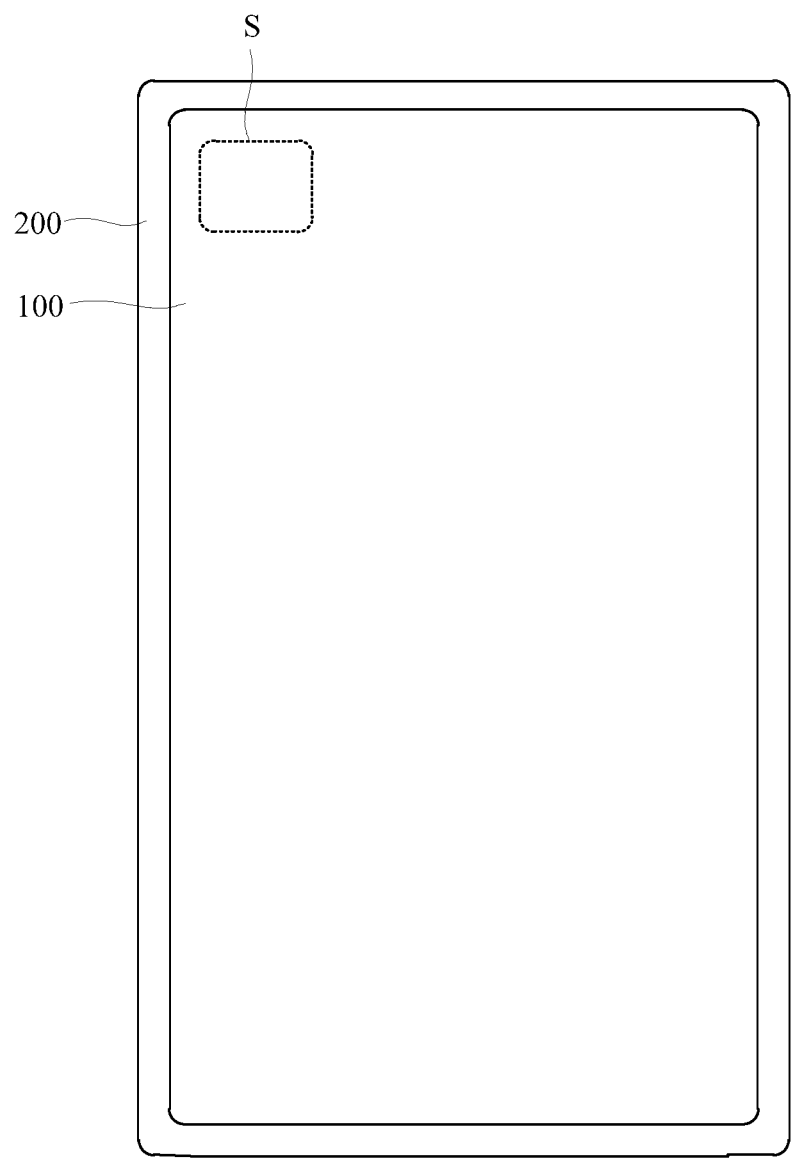
FIG. 1 is a schematic diagram of a display substrate according to at least one embodiment of the present disclosure.

The embodiments of the present disclosure will be described below in combination with the drawings in detail. Implementation modes may be implemented in various forms. Those of ordinary skills in the art may easily understand such a fact that implementation modes and contents may be transformed into one or more forms without departing from the purpose and scope of the present disclosure. Therefore, the present disclosure should not be construed as being only limited to the contents recorded in the following implementation modes. The embodiments in the present disclosure and features in the embodiments may be combined randomly with each other if there is no conflict.

In the drawings, size/sizes of one or more constituent elements, thicknesses of layers, or regions are sometimes exaggerated for clarity. Therefore, one implementation mode of the present disclosure is not necessarily limited to the sizes, and the shapes and sizes of multiple components in the accompanying drawings do not reflect actual scales. In addition, the accompanying drawings schematically show ideal examples, and one mode of the present disclosure is not limited to a shape, a numerical value, or the like shown in the accompanying drawings.

Ordinal numerals such as "first", "second" and "third" in the present disclosure are set to avoid confusion of constituents, but not intended for restriction in quantity. "A plurality of/multiple" in the present disclosure means a quantity of two or more.

In the present disclosure, sometimes for convenience, wordings "central", "up", "down", "front", "back", "vertical", "horizontal", "top", "bottom", "inside", "outside" and the like indicating directional or positional relationships are used to illustrate positional relationships between constituent elements with reference to the drawings. These terms are not intended to indicate or imply that involved devices or elements must have specific orientations and be structured and operated in the specific orientations but only to facilitate describing the present specification and simplify the description, and thus should not be understood as limitations on the present disclosure. The positional relationships between the constituent elements may be changed as appropriate based on the directions according to which the constituent elements are described. Therefore, they are not limited to the wordings described in the specification, which may be replaced appropriately according to situations.

In the present disclosure, unless otherwise specified and defined, terms "mounting", "mutual connection" and "connection" should be understood in a broad sense. For example, a connection may be a fixed connection, or a detachable connection, or an integral connection, it may be a mechanical connection or an electrical connection, it may be a direct connection, or an indirect connection through an intermediate, or an internal communication between two elements. Those of ordinary skills in the art may understand meanings of the above terms in the present disclosure according to situations.

In the present disclosure, a transistor refers to an element at least including three terminals, i.e., a gate electrode, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. In the present disclosure, the channel region refers to a region through which the current mainly flows.

In the present disclosure, a first electrode of a transistor may be a drain electrode, and a second electrode may be a source electrode. Alternatively, the first electrode of the transistor may be a source electrode and the second electrode may be a drain electrode. In addition, a gate of the transistor may be called a control electrode. In the case that transistors with opposite polarities are used, or that a direction of a current changes during operation of a circuit, or the like, functions of the "source electrode" and the "drain electrode" are sometimes exchanged. Therefore, the "source electrode" and the "drain electrode" are interchangeable in the present disclosure.

In the present disclosure, "electric connection" includes a case where constituent elements are connected through an element with a certain electrical action. The "element with the certain electric effect" is not particularly limited as long as electric signals between the connected composition elements may be transmitted. Examples of the "element with the certain electrical action" not only include electrodes and wirings, but also include switching elements such as transistors, resistors, inductors, capacitors, other elements with one or more functions, etc.

In the present disclosure, "parallel" refers to a state in which an angle formed by two straight lines is above −10° and below 10°, and thus may include a state in which the angle is above −5° and below 5°. In addition, "perpendicular" refers to a state that an angle formed by two straight lines is above 80° and below 100°, and thus may include a state that the angle is above 85° and below 95°.

In the present disclosure, "film" and "layer" are interchangeable. For example, sometimes a "conducting layer" may be replaced with a "conducting film". Similarly, sometimes an "insulating film" may be replaced with an "insulating layer".

In the present disclosure, "about" refers to that a boundary is defined not so strictly and numerical values in process and measurement error ranges are allowed.

In the present disclosure, "thickness" refers to a height from a surface base close to the substrate base to a surface away from the substrate in a direction of a plane perpendicular to the substrate base.

In the present disclosure, "gradient" refers to a ratio of a vertical height of a slope surface to a length in a horizontal direction on a plane perpendicular to the display substrate.

An embodiment of the present disclosure provides a display substrate, including a base substrate, wherein the base substrate includes a first display area provided with multiple sub-pixels of different colors. At least one sub-pixel of the multiple sub-pixels of different colors includes a light-emitting element and a pixel driving circuit electrically connected to the light-emitting element. The light-emitting element includes a first electrode, a second electrode, and an organic light-emitting layer provided between the first electrode and the second electrode. The first electrode is electrically connected to the pixel driving circuit. A first structure is provided on a side of the first electrode of the light-emitting element of a sub-pixel of at least one target color close to the base substrate. A surface of the first structure close to the first electrode is uneven. For example, the surface of the first structure close to the first electrode may be convex or concave. However, this embodiment is not limited thereto.

According to the display substrate provided by this embodiment, the first electrode is further provided with an uneven surface by utilizing the uneven surface of the first structure close to the first electrode, and the change of a light emission spectrum of at least one target color with the viewing angle may be adjusted, thereby improving the visual deviation without affecting the front display color gamut of the display substrate.

In some exemplary embodiments, the first structure may include at least one convex structure. An orthographic projection of the first electrode on the base substrate may include an orthographic projection of the at least one convex structure on the base substrate. For example, an orthographic projection of a first electrode of a sub-pixel on the base substrate may include an orthographic projection of one convex structure on the base substrate, or an orthographic projection of a first electrode of a sub-pixel on the base substrate may include an orthographic projection of two convex structures on the base substrate. However, this embodiment is not limited thereto.

In some exemplary embodiments, the first structure may include at least one convex structure and a first insulating layer located on a side of the at least one convex structure close to the base substrate. An orthographic projection of the first insulating layer on the base substrate includes an orthographic projection of the first electrode on the base substrate. In this example, the first structure may be a combined structure of a convex structure and a first insulating layer. However, this embodiment is not limited thereto.

In some exemplary embodiments, a surface of the first insulating layer close to the convex structure is flat. In this example, a non-flat surface of the first structure close to the first electrode is formed by the convex structure. A thickness of the first structure at the convex structure is greater than a thickness at the first insulating layer. However, this embodiment is not limited thereto. For example, the non-flat surface of the first structure close to the first electrode may be jointly formed by the convex structure and the first insulating layer.

In some exemplary embodiments, a surface of the first insulating layer close to the convex structure has a concave surface, and an orthographic projection of the convex structure of the first structure on the base substrate does not overlap an orthographic projection of the concave surface of the first insulating layer on the base substrate. In this example, the non-flat surface of the first structure close to the first electrode is jointly formed by the convex structure and a concave surface of the first insulating layer. A thickness of the first structure at the convex structure is greater than a thickness at the concave surface of the first insulating layer.

In some exemplary embodiments, the at least one convex structure may be made of a metallic material or a photosensitive organic material. In some examples, the convex structure is made of a metallic material and is directly connected to the first electrode, which may reduce resistance and improve conductivity between the first electrode and the pixel driving circuit.

For example, the material of the convex structure may be molybdenum (Mo), aluminum (Al), copper (Cu) and the like. However, this embodiment is not limited thereto.

In some exemplary embodiments, the at least one convex structure is made of a metallic material, and the first structure includes at least one convex structure, and a second insulating layer between the at least one convex structure and the first electrode.

In some exemplary embodiments, the first structure has a flat portion and at least one non-flat portion. An orthographic projection of the flat portion on the base substrate does not overlap an orthographic projection of the at least one non-flat portion on the base substrate. An orthographic projection of the first electrode on the base substrate includes an orthographic projection of the at least one non-flat portion on the base substrate.

In some exemplary embodiments, the at least one non-flat portion includes at least one of a convex structure a concave structure. A thickness of the first structure at the convex structure is greater than a thickness at the flat portion, and a thickness of the first structure at the concave structure is less than a thickness at the flat portion. In some examples, the first structure may have a flat portion and at least one convex structure, and the flat portion is connected between the convex structures. Alternatively, the first structure may have a flat portion and at least one concave structure, and the flat portion is connected between the concave structures. Alternatively, the first structure may have a flat portion, at least one convex structure, and at least one concave structure, and the flat portion may be connected between the convex structure and the concave structure. However, this embodiment is not limited thereto.

In some exemplary embodiments, in a plane perpendicular to the base substrate, the convex structure includes a top surface and a slope surface connecting to the top surface, and an angle between a tangent of the slope surface and a plane parallel to the base substrate is about 3° to 30°. In some examples, when the convex structure is an independent structure, the convex structure further includes a bottom surface connecting to the slope surface. For example, in a plane perpendicular to the display substrate, the convex structure may be trapezoidal. However, this embodiment is not limited thereto.

In some exemplary embodiments, the convex structure may have a height of about 100 nm to 5 μm. In some examples, when the convex structure is an independent structure, the height of the convex structure may be a distance between a top surface and a bottom surface of the convex structure. In some examples, when the convex structure is a protrusion that protrudes from the flat portion to a side away from the base substrate, the height of the convex structure may be a distance between a top surface of the protrusion away from the base substrate and a top surface of the flat portion away from the base substrate. However, this embodiment is not limited thereto.

In some exemplary embodiments, in a plane parallel to the base substrate, a length of the convex structure in a first direction is less than a length of the corresponding sub-pixel in the first direction, and the length of the convex structure in a second direction is less than a length of the corresponding sub-pixel in the second direction. The first direction crosses the second direction. For example, the first direction is a column direction of the sub-pixel arrangement, and the second direction is a row direction of the sub-pixel arrangement. In some examples, a first ratio between a length of the sub-pixels in the first direction and a length of the sub-pixels in the second direction is about 0.5 to 2. The convex structure has a second ratio between the length in the first direction and the length in the second direction. When the first display area is a curved display area, the second ratio of the convex structure may be greater than the first ratio of the sub-pixels. For example, a ratio of the second ratio to the first ratio may be about 1 to 3, thereby improving the lateral viewing angle. When the first display area is a flat surface display area, the second ratio of the convex structure may be less than the first ratio of the sub-pixels. For example, a ratio of the second ratio to the first ratio may be about 0.5 to 2, thereby improving the viewing angle of the flat surface display area.

In some exemplary embodiments, in a plane parallel to the base substrate, the convex structure has a width of about 500 nanometers (nm) to 15 microns (m), and a non-planar structure formed by the first electrode based on the convex structure has a width of about 1 μm to 25 μm. For example, a width of the convex structure is about 7.5 μm, and a width of the non-planar structure of the first electrode is about 10 μm. In the present disclosure, "length" refers to a feature dimension in the first direction (e.g., column direction of sub-pixels) and "width" refers to a feature dimension in the second direction (e.g., row direction of sub-pixels). The first direction crosses the second direction. For example, the first direction is perpendicular to the second direction. In some examples, the width is less than the length.

In some exemplary embodiments, a shape of the non-planar structure formed by the first electrode based on the first structure is different from a shape of the base substrate. In this example, the non-planar structure formed by the first electrode is not formed due to bending of the flexible base substrate, but is formed by providing the first structure having a non-planar surface.

In some exemplary embodiments, the first electrode may be a reflective electrode. For example, the first electrode is a total reflective anode, the second electrode is a semi-reflective cathode, and the display substrate in this example may be a display substrate of a top emission structure. However, this embodiment is not limited thereto. In some examples, the first electrode may be a transparent anode and the second electrode may be a reflective cathode, a non-planar structure may be formed on a side of the reflective cathode close to the organic light-emitting layer by the first structure provided on a side of the transparent anode close to the base substrate to improve the visual deviation, and the display substrate in this example may be a display substrate of a bottom emission structure.

In some exemplary embodiments, the sub-pixel of at least one target color may include at least one of a blue sub-pixel, a green sub-pixel, and a red sub-pixel. For example, if the first display area is provided with sub-pixels of three colors (i.e., red sub-pixel, green sub-pixel and blue sub-pixel), the target color may be blue sub-pixel, or green sub-pixel, or blue sub-pixel and green sub-pixel, or blue sub-pixel, green sub-pixel and red sub-pixel. However, this embodiment is not limited thereto. In some examples, the sub-pixels of multiple colors provided in the first display area may be used as sub-pixels of target color.

In some exemplary embodiments, the pixel driving circuit includes: an active layer, a first gate metal layer, a second gate metal layer, a first source-drain metal layer and a second source-drain metal layer that are sequentially provided on the base substrate. The first structure is provided between the second source-drain metal layer and the light-emitting element, and a thickness of the first structure is less than or equal to 2 μm. The first source-drain metal layer and the second source-drain metal layer satisfy at least one of the following: an overlapping area of an orthographic projection of the first source-drain metal layer and the second source-drain metal layer of the pixel driving circuit of the sub-pixel of at least one target color on the base substrate is greater than an overlapping area of an orthographic projection of the first source-drain metal layer and the second source-drain metal layer of the pixel driving circuit of a sub-pixel of a color other than the at least one target color; and a thickness of the second source-drain electrode layer of the pixel driving circuit of the sub-pixel of at least one target color is greater than a thickness of the second source-drain metal layer of the pixel driving circuit of the sub-pixel of the color other than the at least one target color. According to the present exemplary embodiment, a topography of the first electrode of the sub-pixel of the target color is adjusted by changing a layout of the pixel driving circuit, or the topography of the first electrode of the sub-pixel of the target color is adjusted by changing a thickness of the second source-drain metal layer.

In some exemplary embodiments, the base substrate further includes a second display area. The second display area is a flat surface display area, and the first display area is a curved display area or a bent display area around the second display area. For example, the display substrate may be a curved surface display substrate. Therefore, only by changing the topography of the first electrode of the sub-pixel of the target color of the curved display area or the bent display area of the display substrate, may the visual deviation of the curved display area or the bent display area be pertinently improved and the normal display effect of the flat surface display area of the display substrate be ensured.

In some exemplary embodiments, the second electrodes of the first and second display areas are integrated, and the insulating layers of the first and second display areas are integrated. In this example, the first display area and the second display area are communicated areas.

The solution of the present embodiment is illustrated below by some examples.

FIG. 1 is a schematic diagram of a display substrate according to at least one embodiment of the present disclosure. As shown in FIG. 1, the display substrate in this embodiment includes a display area 100 and a non-display area 200 located on a periphery of the display area 100. The non-display area 200 includes a peripheral area surrounding the display area 100 and a bonding area located on a side of the display area 100. The display area 100 is provided with multiple sub-pixels of different colors, and at least one of the multiple sub-pixels includes a light-emitting element and a pixel driving circuit electrically connected to the light-emitting element. The light-emitting element includes a first electrode, a second electrode, and an organic light-emitting layer located between the first electrode and the second electrode. The first electrode is electrically connected to the pixel driving circuit. In some examples, the first electrode may be a total reflective anode and the second electrode may be a semi-reflective cathode. Alternatively, the first electrode may be a transparent anode and the second electrode may be a reflective cathode. The peripheral area at least includes a signal line for transmitting a voltage signal to the multiple sub-pixels, for example, a low-potential power supply line (VSS). The bonding area at least includes a bonding circuit for connecting signal lines of the multiple sub-pixels to an external circuit board, and the bonding circuit may include, for example, multiple bonding electrodes bound to the external circuit board. However, the size and resolution of the display substrate are not limited in this embodiment.

Figure 2:
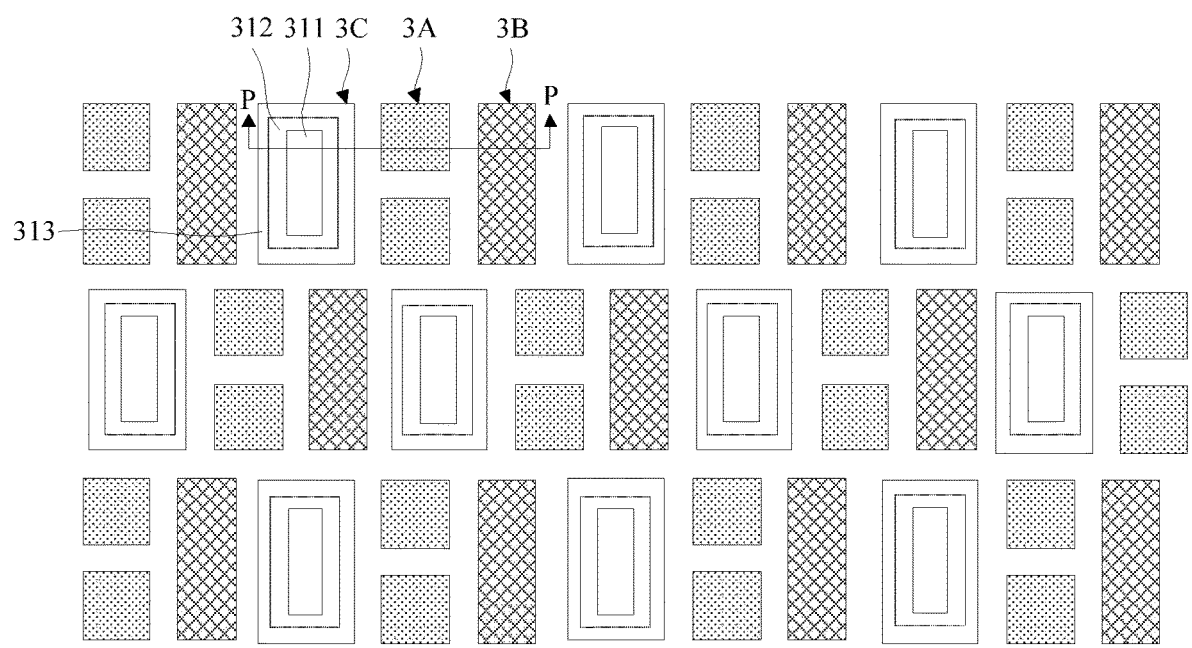
FIG. 2 is a schematic structural diagram of multiple sub-pixels of a display substrate according to at least one embodiment of the present disclosure.

FIG. 2 is a schematic structural diagram of multiple sub-pixels of a display substrate according to at least one embodiment of the present disclosure. FIG. 2 is a partial enlarged schematic diagram of an area S in FIG. 1. In some exemplary embodiments, as shown in FIG. 2, multiple repetitive units are arranged on each row on a plane parallel to the display substrate. Each repetitive unit includes two sub-pixels 3A of a first color, one sub-pixel 3B of a second color, and one sub-pixel 3C of a third color. In one repetitive unit, the sub-pixel 3B of the second color and the sub-pixel 3C of the third color are located on both sides of the two sub-pixels 3A of the first color in the row direction, and the two sub-pixels 3A of the first color are arranged in the column direction. In some examples, the repetitive units between two adjacent rows are shifted in the row direction. For example, the repetitive unit between two adjacent rows has a shift of 1.5 times the width of the sub-pixel 3C of the third color in the row direction. However, this embodiment is not limited thereto.

As shown in FIG. 2, in this example, the two sub-pixels 3A of the first color in the repetitive unit are symmetrical to each other and the symmetry axis is parallel to the row direction. The sub-pixels 3A of first color may be rectangular (e.g., rounded rectangular) or square or pentagonal. The sub-pixel 3B of second color and the sub-pixel 3C of third color may both be rectangular (e.g., rounded rectangular) or hexagonal. A length of the sub-pixel 3B of second color in the column direction may be the same as that of the sub-pixel 3C of third color, and a length of the sub-pixel 3A of first color in the column direction is less than a length of the sub-pixel 3B of second color in the column direction. A length of the sub-pixel 3A of first color in the row direction may be greater than or equal to a length of the sub-pixel 3B of second color in the row direction, and a length of the sub-pixel 3C of third color in the row direction may be greater than a length of the sub-pixel 3A of first color in the row direction. In some examples, the sub-pixel 3A of first color may be a green (G) sub-pixel, the sub-pixel 3B of second color may be a red (R) sub-pixel, and the sub-pixel 3C of third color may be a blue (B) sub-pixel. However, shapes and arrangement manner of the multiple sub-pixels in the display area are not limited in this embodiment. In some examples, the multiple sub-pixels in the display area may be arranged in an RGB pattern. For example, each row is arranged according to a repetitive unit of a red sub-pixel, a green sub-pixel, and a blue sub-pixel, and the sub-pixels of each column have the same color. Alternatively, in some examples, the multiple sub-pixels in the display area may be arranged in a PenTile pattern. For example, each pixel unit may include red sub-pixels and green sub-pixels, or blue sub-pixels and green sub-pixels, and each pixel unit may borrow the pixes of another color from the adjacent pixel unit to form three primary colors.

In some exemplary embodiments, as shown in FIG. 2, on a plane parallel to the display substrate, surfaces of the first electrodes of the light-emitting elements of the sub-pixel 3A of first color and the sub-pixel 3B of second color close to the organic light-emitting layer are both planar. A first structure is provided on a side of the first electrode of the light-emitting element of the sub-pixel 3C of third color close to the base substrate, and a surface of the first structure close to the first electrode is uneven, such that a surface of the first electrode of the light-emitting element of the sub-pixel 3C of third color close to the organic light-emitting layer has a non-planar structure. An orthographic projection of the first structure on the base substrate on a side of the first electrode of the light-emitting element of the sub-pixel 3C of third color close to the base substrate overlaps with an orthographic projection of a light-emitting area of the light-emitting element of the sub-pixel 3C of third color on the base substrate. For example, the first structure includes at least one convex structure, and an projection of the light-emitting area of the light-emitting element of the sub-pixel 3C of third color on the base substrate includes an orthographic projection of the at least one convex structure of the first structure on the base substrate. In this example, the light-emitting area of the light-emitting element is an area for light emitting which is exposed by the opening of a pixel definition layer.

In some examples, as shown in FIG. 2, the first structure located on a side of the first electrode of the light-emitting element of the sub-pixel 3C of third color close to the base substrate may include a first planar region 311, a first slope region 312, and a second planar region 313. The first planar region 311 and the second planar region 313 may be parallel to each other, and the first slope region 312 is connected to the first planar region 311 and the second planar region 313.

In some examples, an orthographic projection of the second planar region 313 on the base substrate does not overlap with an orthographic projection of the first slope region 312 and the first planar region 311 on the base substrate. In some examples, the first structure may include a flat portion and a concave structure. For example, an orthographic projection of the first planar region 311 on the base substrate may be rectangular; an orthographic projection of the first slope region 312 on the base substrate may surround a periphery of the orthographic projection of the first planar region 311 on the base substrate, and an orthographic projection of the first slope region 312 on the base substrate may be a rectangular ring; an orthographic projection of the second planar region 313 on the base substrate may surround a periphery of the orthographic projection of the first slope region 312 on the base substrate, and the orthographic projection of the second planar region 313 on the base substrate may be a rectangular ring. However, this embodiment is not limited thereto. For example, the orthographic projection of the first planar region on the base substrate may be circular, elliptical, or other pattern, and the orthographic projections of the first slope region and the second planar region on the base substrate may be circular, elliptical, or other shaped ring. For example, the orthographic projection of the first planar region on the base substrate may be elliptical and the orthographic projection of the second planar region on the base substrate may be a rectangular ring.

In some examples, the orthographic projection of the second planar region 313 on the base substrate may include the orthographic projections of the first slope region 312 and the first planar region 311 on the base substrate. In this example, the first structure may include a convex structure. For example, the orthographic projection of the first planar region 311 on the base substrate may be rectangular; the orthographic projection of the first slope region 312 on the base substrate surrounds a periphery of the orthographic projection of the first planar region 311 on the base substrate, and the orthographic projection of the first slope region 312 on the base substrate may be, for example, a rectangular ring; the orthographic projection of the second planar region 313 on the base substrate may be rectangular and covers the orthographic projections of the first slope region 312 and the first planar region 311 on the base substrate. However, this embodiment is not limited thereto.

In some examples, in a plane perpendicular to the base substrate, a distance between the first planar region 311 and the base substrate is greater than a distance between the second planar region 313 and the base substrate, i.e., the first structure may include a convex structure. Alternatively the distance between the first planar region 311 and the base substrate is less than the distance between the second planar region 313 and the base substrate, i.e., the first structure may include a concave structure.

In some examples, the first structure on a side of the first electrode of the light-emitting element of the sub-pixel 3C of third color close to the base substrate may include a convex structure such that the first electrode of the light-emitting element of the sub-pixel 3C of third color has a convex surface protruding toward a side away from the base substrate. The convex structure included by the first structure has a flat convex top surface and a convex bottom surface parallel to the convex top surface, and the convex top surface and the convex bottom surface are connected by a convex slope surface. Therefore, the first planar region 311 may be the convex top surface, the first slope surface region 312 may be the convex slope surface, and the second planar region 313 may be an extension plane of the convex bottom surface. Alternatively, in some examples, the first structure on a side of the first electrode of the light-emitting element of the sub-pixel 3C of third color close to the base substrate may include a concave structure. The concave structure has a flat groove bottom surface and a groove top surface parallel to the groove bottom surface, and the groove top surface and the groove bottom surface are connected by a groove slope surface. Therefore, the first planar region 311 may be the groove bottom surface, the first slope region 312 may be the groove slope surface, and the second planar region 313 may be an extension plane of the groove top surface. However, this embodiment is not limited thereto.

Figure 3A:
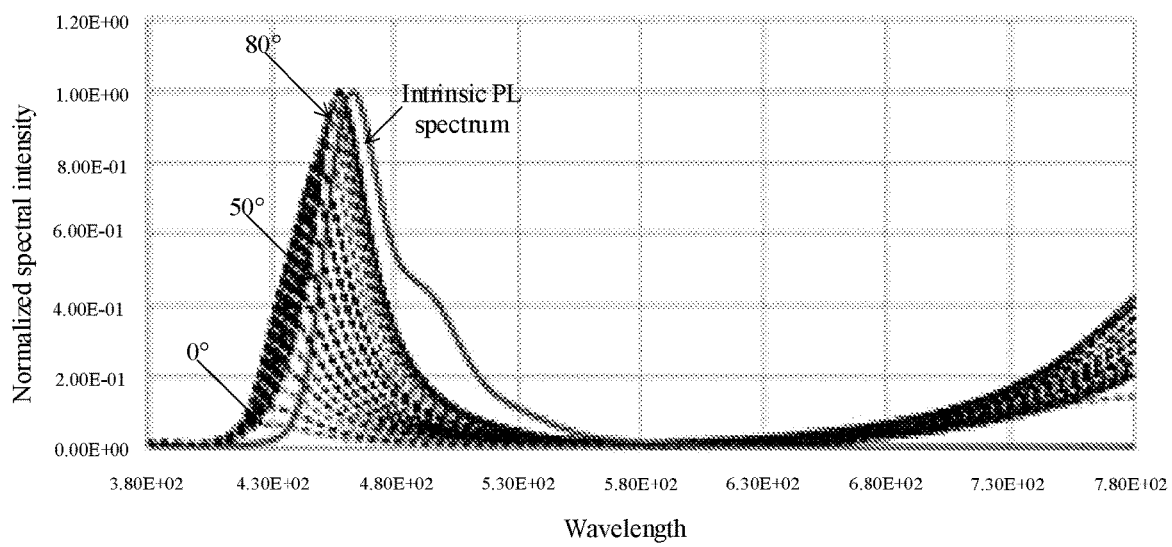
FIG. 3A is a schematic diagram of a relative relationship between microcavity factors and intrinsic PL spectra from different viewing angles.
Figure 3B:
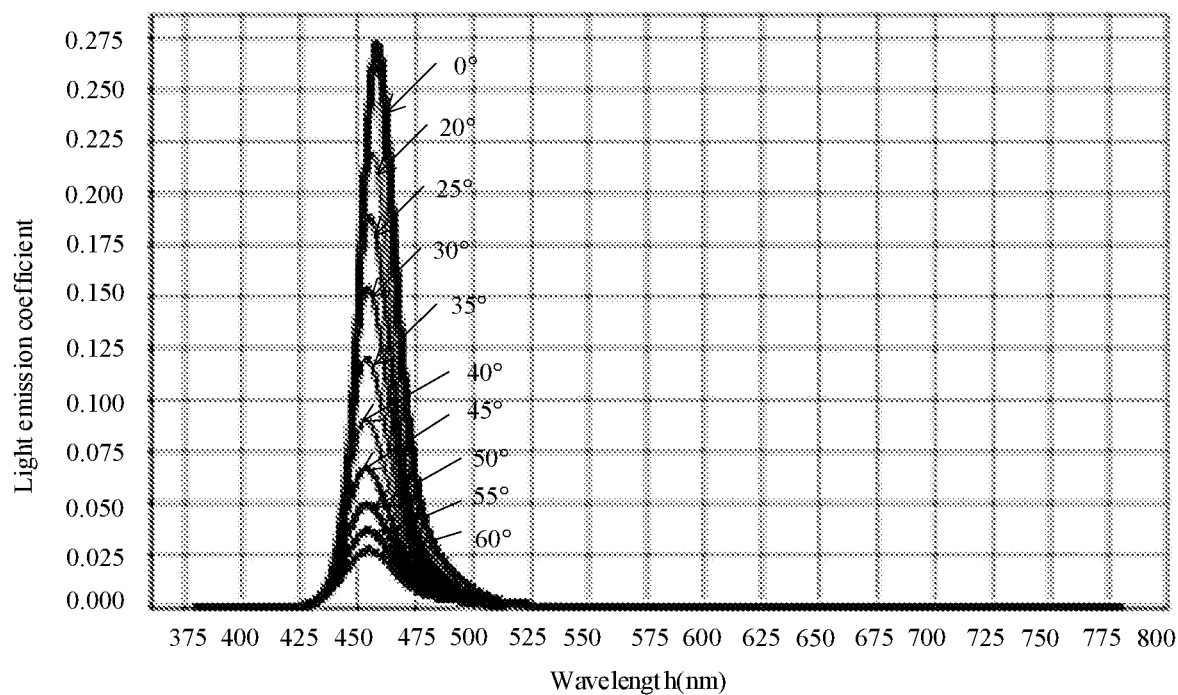
FIG. 3B is a schematic diagram showing a change of a light emitting spectrum of the light-emitting element with viewing angle.
Figure 4:
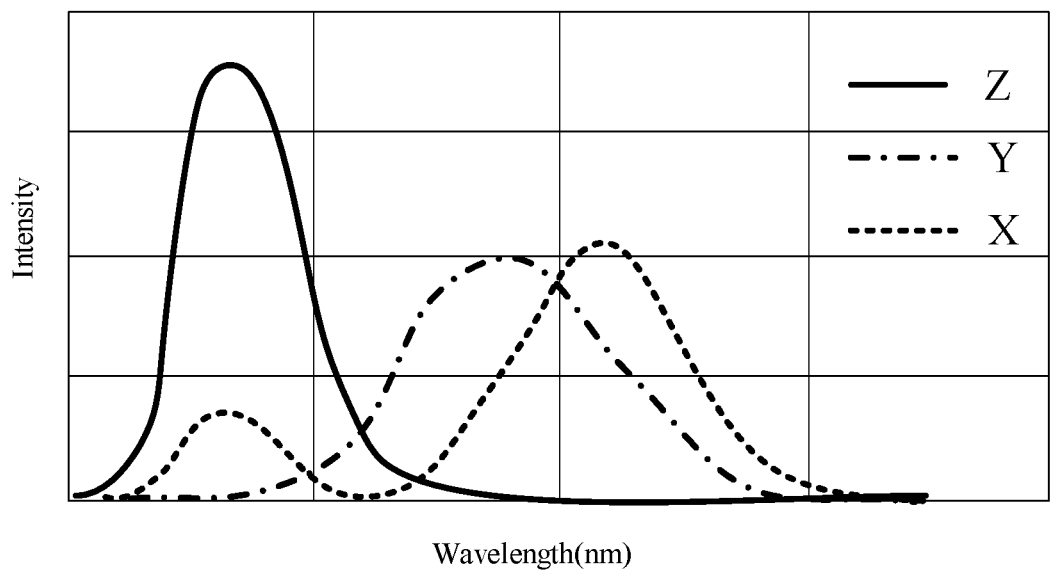
FIG. 4 is a schematic diagram of spectral tristimulus value spectrum.
Figure 5:
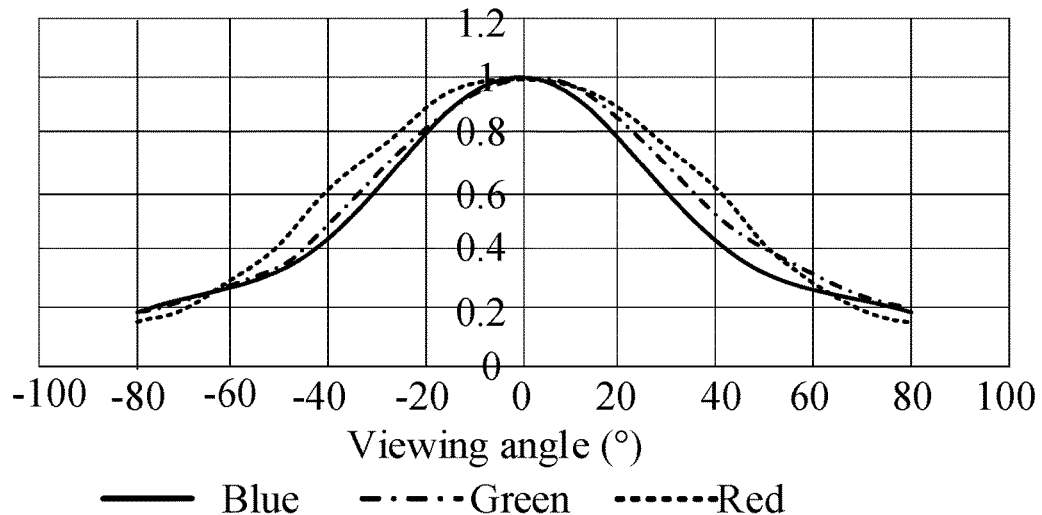
FIG. 5 shows change curves of red, green and blue brightness of OLED light-emitting element with viewing angle.

In some exemplary embodiments, as shown in FIG. 2, the sub-pixel 3A of first color may be a green sub-pixel, the sub-pixel 3B of second color may be a red sub-pixel, and the sub-pixel 3C of third color may be a blue sub-pixel. With a display substrate with a top emission structure as an example, the first electrode may be a total reflective anode and the second electrode may be a semi-reflective cathode. The total reflective anode, organic light-emitting layer and semi-reflective cathode together constitute a microcavity structure. On the one hand, the microcavity structure of top-emitting OLED may enhance the light intensity of the positive viewing angle of the light-emitting element, on the other hand, it may also improve the color purity of the light spectrum and enhance the saturation of the display tone. The influence of the microcavity factor on the light emission of the light-emitting element may be regarded as the multiplication of the microcavity factor and the intrinsic PL spectrum of the light-emitting element. FIG. 3A is a schematic diagram of a relative relationship between microcavity factors and intrinsic photoluminescence (PL) spectra from different viewing angles. In FIG. 3A, the dotted lines represent the OLED microcavity functions at different angles, and the solid line represents the intrinsic PL spectrum of the material. As shown in FIG. 3A, the microcavity factor increases with the viewing angle. FIG. 3B is a schematic diagram showing a change of a light emitting (EL) spectrum of the light-emitting element with viewing angle. As shown in FIG. 3B, after the action of the microcavity factor, the intensity of the light emitting spectrum of the light-emitting element decreases with the increase of the viewing angle, and the peak position of the spectrum shifts to the short wavelength. In an OLED light-emitting element, white light is formed by mixing red, green and blue colors. When the brightness and hue of the three colors are inconsistent with the change of viewing angle, the synthesized white light will undergo color cast. FIG. 4 is a schematic diagram of spectral tristimulus value spectrum. As shown in FIG. 4, from the knowledge of chromaticity, it can be seen that the luminance information of light is mainly related to the Y stimulus value in the spectral tristimulus value spectrum. From the relative position relationship between red, green and blue spectrum and Y stimulus value in tristimulus value spectrum, it can be seen that the decay of blue light with visual angle is faster than that of green light and red light, and the decay of red light with visual angle is the slowest, as shown in FIG. 5. Based on this, in this exemplary embodiment, only the blue sub-pixel is used as the sub-pixel of target color, a first structure is provided on a side of the reflective electrode of the light-emitting element of the blue sub-pixel close to the base substrate, and a surface of the first structure close to the reflective electrode of the light-emitting element of the blue sub-pixel is uneven, such that the reflective electrode of the light-emitting element of the blue sub-pixel has a non-planar structure, so as to adjust the microcavity structure of the blue sub-pixel and adjust the change of the light emitting spectrum of the blue sub-pixel with the viewing angle, thereby improving the visual deviation of the display substrate without affecting the front display color gamut of the display substrate.

Figure 6:
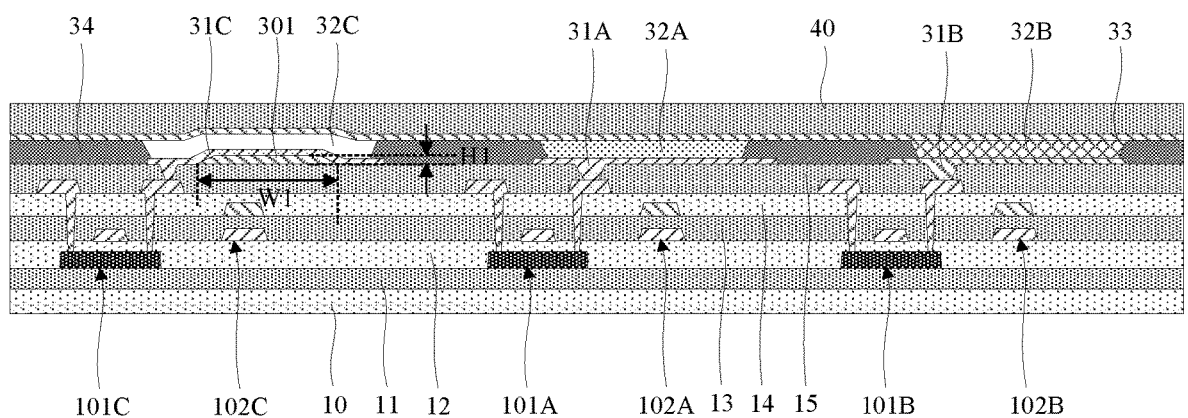
FIG. 6 is a schematic sectional view along a P-P direction in FIG. 2.

FIG. 6 is a schematic sectional view along a P-P direction in FIG. 2. In some exemplary embodiments, as shown in FIG. 6, in a plane perpendicular to the display substrate, the display area include a driving structure layer provided on the base substrate 10, a first structure provided on a side of the driving structure layer away from the base substrate 10, and a light-emitting structure layer provided on a side of the first structure away from the base substrate 10. The driving structure layer includes multiple pixel driving circuits, and the light-emitting structure layer includes multiple light-emitting elements, which are connected one-to-one with the multiple pixel driving circuits. Each pixel driving circuit includes multiple transistors and at least one storage capacitor, which may be of a 2T1C, 3T1C, 5T1C or 7T1C design, for example. FIG. 6 takes sub-pixels of three different colors (i.e., a sub-pixel 3A of first color, a sub-pixel 3B of second color, and a sub-pixel 3C of third color) as an example for illustration, and the pixel driving circuit of each sub-pixel is illustrated with only one transistor and one storage capacitor as an example.

In some exemplary embodiments, as shown in FIG. 6, in a plane perpendicular to the display substrate, the driving structure layer includes a buffer layer 11, an active layer, a first gate insulating layer 12, a first gate metal layer, a second gate insulating layer 13, a second gate metal layer, an interlayer insulating layer 14, and a source-drain metal layer which are sequentially stacked on the base substrate 10. The active layer includes at least a first active layer, a second active layer, and a third active layer. The first gate metal layer includes at least a first gate electrode, a second gate electrode, a third gate electrode, a first capacitor electrode, a second capacitor electrode and a third capacitor electrode. The second gate metal layer includes at least a fourth capacitor electrode, a fifth capacitor electrode and a sixth capacitor electrode. The source and drain metal layer includes at least a first source electrode, a first drain electrode, a second source electrode, a second drain electrode, a third source electrode and a third drain electrode. The first active layer, the first gate electrode, the first source electrode and the first drain electrode form a first thin film transistor 101A, and the first capacitor electrode and the fourth capacitor electrode form a first storage capacitor 102A. The second active layer, the second gate electrode, the second source electrode and the second drain electrode form a second transistor 101B, and the second capacitor electrode and the fifth capacitor electrode form a second storage capacitor 102B. The third active layer, the third gate electrode, the third source electrode and the third drain electrode form a third transistor 101C, and the third capacitor electrode and the sixth capacitor electrode form a third storage capacitor 102C.

In some exemplary embodiments, as shown in FIG. 6, on a plane perpendicular to the display substrate, the first structure includes a first planarization layer 15 and at least one convex structure (taking a first bump 301 shown in FIG. 6 as an example). The first planarization layer 15 is the first insulating layer. In this example, the surface of the first planarization 15 on a side close to the convex structure is flat. The first planarization 15 is located on a side of the driving structure layer away from the base substrate 10, and the at least one convex structure is located on a side of the first planarization 15 away from the base substrate 10. The light-emitting area of the sub-pixel of third color overlaps with an orthographic projection of the convex structure on the base substrate 10. For example, an orthographic projection of the first bump 301 on the base substrate 10 is located within the light-emitting area of the sub-pixel of third color. Since the first structure includes a convex structure, a surface of the first structure close to the first electrode of the light-emitting element of the sub-pixel of third color is uneven, and a surface of the first electrode of the light-emitting element of the sub-pixel of third color close to the organic light-emitting layer is also uneven. That is, the surface of the first electrode of the light-emitting element of the sub-pixel of third color close to the organic light-emitting layer has a non-planar structure.

In this example, as shown in FIG. 6, a width of a surface of the first bump 301 on a side away from the base substrate 10 (i.e., a top surface) is less than a width of the surface on a side close to the base substrate (i.e., a bottom surface), and the top surface and the bottom surface of the first bump 301 are connected by a slope surface. In a plane perpendicular to the display substrate, the first bump 301 may be trapezoidal. The gradient of the slope surface of the first bump 301 may be about 3° to 30°. For example, the gradient of the slope surface of the first bump 301 may be about 5°. Orthographic projections of the top and bottom surfaces of the first bump 301 on the base substrate 10 may be rectangular, and an orthographic projection of the slope surface of the first bump 301 on the base substrate 10 may be a rectangular ring around the top surface. However, this embodiment is not limited thereto. For example, the orthographic projections of the top and bottom surfaces of the first bump 301 on the base substrate may be circular or elliptical, and the orthographic projection of the slope surface on the base substrate may be a circular or elliptical ring around the top surface. In some examples, the orthographic projections of the top and bottom surfaces of the first bump 301 on the base substrate may be of different shapes. For example, the orthographic projection of the top surface on the base substrate may be circular or elliptical, and the orthographic projection of the bottom surface on the base substrate may be rectangular. In some examples, the gradients of the slopes around the top surface of the first bump may be the same, or may be partially the same. For example, the gradients of the slopes on the left and right sides of the top surface are the same and less than or greater than the gradients of the slopes on the upper and lower sides. However, this embodiment is not limited thereto.

In some examples, a distance between the top surface and the bottom surface of the first bump 301 (the first thickness H1 shown in FIG. 6) may be about 100 nm to 3 μm, for example, the first thickness H1 may be 0.5 μm. Taking the rectangular orthographic projection of the first bump 301 on the base substrate 10 as an example, a first length of the orthographic projection of the first bump 301 on the base substrate 10 may be less than a length of the pixel opening formed by the pixel definition layer 34. For example, the first length may be about 5 to 20 μm; and for example, the first length may be about 10 μm. A first width of the orthographic projection of the first bump 301 on the base substrate 10 may be less than a width of the pixel opening formed by the pixel definition layer 34. For example, the first width W1 of the orthographic projection of the first bump 301 on the base substrate 10 may be about 500 nm to 15 μm; and for example, the first width W1 may be about 7.5 μm. However, this embodiment is not limited thereto.

In the present disclosure, "length" refers to a feature dimension in the first direction (e.g., column direction of sub-pixels) and "width" refers to a feature dimension in the second direction (e.g., row direction of sub-pixels). The first direction crosses the second direction. For example, the first direction is perpendicular to the second direction.

In some exemplary embodiments, as shown in FIG. 6, in a plane perpendicular to the display substrate, a light-emitting structure layer is provided on a side of the first structure away from the base substrate 10. At least one light-emitting element of the light-emitting structure layer includes a first electrode (for example, a first anode 31A, a second anode 31B, or a third anode 31C shown in FIG. 6), an organic light-emitting layer (for example, a first organic light-emitting layer 32A, a second organic light-emitting layer 32B, or a third organic light-emitting layer 32C shown in FIG. 6), a second electrode 33, and a pixel definition layer 34 which are sequentially stacked, in this example, the first electrode is a reflective anode, and the second electrode 33 is a semi-reflective cathode. The first electrode is connected to a transistor of the pixel driving circuit through a via hole provided in the first planarization 15. The organic light-emitting layer includes a multi-layer structure composed of one or more film layers selected from an Emitting Layer (EML), a Hole Injection Layer (HIL), a Hole Transport Layer (HTL), a Hole Block Layer (HBL), an Electron Block Layer (EBL), an Electron Injection Layer (EIL), and an Electron Transport Layer (ETL). For example, under driving of voltages of the first electrode and the second electrode, light is emitted according to a required gray scale by utilizing light emitting characteristics of an organic material. Light-emitting elements of different colors have different light-emitting layers. For example, red light-emitting element includes a red light-emitting layer, green light-emitting element includes a green light-emitting layer, and blue light-emitting element includes a blue light-emitting layer. The pixel definition layer 34 includes multiple pixel openings arranged regularly, and the pixel definition layer 34 within each pixel opening is etched away to expose the first electrode. Each pixel opening may be rectangular or rectangular with rounded corners, and a cross-sectional shape of each pixel opening may be inverted trapezoid. The organic light-emitting layer is provided in the pixel opening of the pixel definition layer 34 and is in contact with the first electrode, and a second electrode 33 covers a surface of the organic light-emitting layer and is in contact with the organic light-emitting layer. As shown in FIG. 6 the third anode 31C of the sub-pixel 3C of third color covers the first bump 301 and is in direct contact with a surface of the first bump 301 away from the base substrate 10. Since the first bump 301 has a surface protruding towards the third anode 31C, the third anode 31C formed on the first bump 301 may have a surface protruding toward the organic light-emitting layer 32C. The organic light-emitting layer 32C also has a surface protruding toward the second electrode 33, which has a surface protruding toward the encapsulation layer 40, and then the light-emitting direction of the third color light emitted through the second electrode 33 reflected by the third anode 31C may be changed. In other words, the topography of the third anode 31C, the organic light-emitting layer 32C and the second electrode 33 is adjusted by the first bump 301 of the first structure. In this example, a thickness of the light-emitting area of the light-emitting element of the sub-pixel 3C of third color gradually decreases from the middle to the periphery.

In some exemplary embodiments, as shown in FIG. 6, on a plane perpendicular to the display substrate, a surface of the first anode 32A of the light-emitting element of the sub-pixel 3A of first color on a side close to the first organic light-emitting layer 32A is flat, and a surface of the second anode 32B of the light-emitting element of the sub-pixel 3B of second color on a side close to the second organic light-emitting layer 32B is flat. A distance between a surface of the first anode 31A of the light-emitting element of the sub-pixel 3A of first color on a side close to the first organic light-emitting layer 32A and the base substrate 10 is approximately equal to a distance between a surface of the second anode 31B of the light-emitting element of the sub-pixel 3B of second color on a side close to the second organic light-emitting layer 32B and the base substrate 10, and is approximately equal to a distance between a surface of the third anode 31C of the light-emitting element of the sub-pixel 3C of third color on a side close to the third organic light-emitting layer 32C except the first bump 301 and the base substrate 10.

The structure of the display substrate will be described below through an example of a manufacturing process of the display substrate. The "patterning process" mentioned in the present disclosure includes processes, such as film layer deposition, photoresist coating, masking and exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a thin film layer prepared from a material on a base substrate by using a process of deposition or coating. If the patterning process is not needed for the "thin film" in the whole preparation process, the "thin film" may also be referred to as a "layer". When the patterning process is needed for the "thin film" in the whole preparation process, the thin film is referred to as a "thin film" before the patterning process and referred to as a "layer" after the patterning process. The "layer" after the patterning process includes at least one "pattern".

"A and B are arranged in the same layer" mentioned in the present disclosure refers to that A and B are simultaneously formed by the same patterning process. The "thickness" of the film layer is a size of the film layer in a direction perpendicular to the display substrate. In an exemplary embodiment of the present disclosure, "an orthographic projection of A includes an orthographic projection of B" refers to that a boundary of an orthographic projection of B falls within a boundary of an orthographic projection of A, or the boundary of the orthographic projection of A overlaps with the boundary of the orthographic projection of B.

In some exemplary embodiments, a manufacturing process of the display substrate may include the steps as shown in FIGS. 7A to 7F. Descriptions are made in this exemplary embodiment taking a display substrate with a top-emission structure as an example. FIGS. 7A to 7F are all schematic sectional views along a P-P direction in FIG. 2.

(1) Manufacturing a Flexible Base Substrate on a Glass Carrier Plate.

In some exemplary embodiments, the flexible base substrate 10 may include a first flexible material layer, a first inorganic material layer, a semiconductor layer, a second flexible material layer and a second inorganic material layer stacked on the glass carrier plate 1.

Figure 7A:
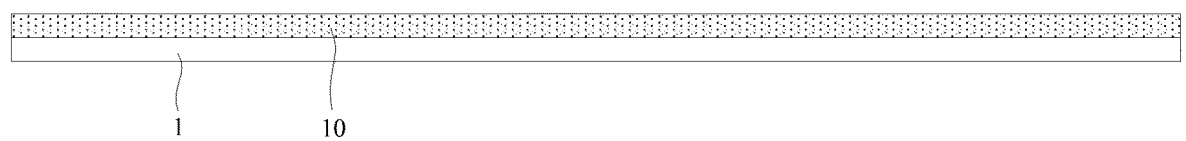
FIG. 7A is a schematic diagram of a display substrate after a base substrate is formed according to at least one embodiment of the present disclosure.

Materials of the first and second flexible material layers may include polyimide (PI), polyethylene terephthalate (PET) or polymer soft film after surface treatment, and materials of the first and second inorganic material layers may include silicon nitride (SiNx) or silicon oxide (SiOx) to improve anti-water-oxygen capability of the base substrate. The first and second inorganic material layers may also be called barrier layers, and amorphous silicon (a-si) may be used as a material of the semiconductor layer. In some exemplary embodiments, taking a stacked structure PI1/Barrier1/a-si/PI2/Barrier2 as an example, its manufacturing process may include: firstly coating a layer of polyimide on a glass carrier board, and curing it into a film to form a first flexible (PI1) layer; then depositing a layer of barrier thin film on the first flexible layer to form a first barrier (Barrier1) layer overlying the first flexible layer; then depositing a layer of amorphous silicon thin film on the first barrier layer to form an amorphous silicon (a-si) layer overlying the first barrier layer; then coating a layer of polyimide on the amorphous silicon layer, and curing it into a film to form a second flexible (PI2) layer; and then depositing a barrier thin film on the second flexible layer to form a second barrier (Barrier2) layer overlying the second flexible layer, thus completing the manufacturing of the flexible base substrate, as shown in FIG. 7A.

(2) Manufacturing a Pattern of a Driving Structure Layer on the Base Substrate.

In some exemplary embodiments, the driving structure layer includes multiple pixel driving circuits. Each of the pixel driving circuits includes multiple transistors and at least one storage capacitor, for example, a 3T1C, 5T1C or 7T1C design may be used.

In some exemplary embodiments, a process of manufacturing the driving structure layer may include the following operations.

A first insulating thin film and an active layer thin film are sequentially deposited on the base substrate, and the active layer thin film is patterned by a patterning process to form a buffer layer 11 covering the entire base substrate 10 and an active layer pattern provided on the buffer layer 11. The active layer pattern is formed in the display area, and includes at least a first active layer 21A, a second active layer 21B and a third active layer 21C.

Then, a second insulating film and a first metal film are sequentially deposited, and the first metal film is patterned by a patterning process to form a first gate insulating layer 12 covering the active layer pattern, and a first gate metal layer pattern provided on the first gate insulating layer 12. The first gate metal layer pattern is formed in the display area and includes at least a first gate electrode 22A, a second gate electrode 22B, a third gate electrode 22C, a first capacitor electrode 23A, a second capacitor electrode 23B, a third capacitor electrode 23C, multiple gate lines (not shown), and multiple first gate leads (not shown).

Then, a third insulating thin film and a second metal film are sequentially deposited, and the second metal film is patterned by a patterning process to form a second gate insulating layer 13 covering the first gate metal layer, and a second gate metal layer pattern provided on the second gate insulating layer 13. The second gate metal layer pattern is formed in the display area, and includes at least a fourth capacitive electrode 24A, a fifth capacitive electrode 24B, a sixth capacitive electrode 24C, and a second gate lead (not shown). The position of the fourth capacitive electrode 24A corresponds to the position of the first capacitive electrode 23A, the position of the fifth capacitive electrode 24B corresponds to the position of the second capacitive electrode 23B, and the position of the sixth capacitive electrode 24C corresponds to the position of the third capacitive electrode 23C.

Subsequently, a fourth insulating film is deposited, and the fourth insulating film is patterned by a patterning process to form an interlayer insulating layer 14 pattern covering the second gate metal layer. The interlayer insulating layer 14 is provided with multiple first via holes, multiple second via holes and multiple third via holes. The positions of two first via holes correspond to the positions of both ends of the first active layer 21A, the positions of two second via holes correspond to the positions of both ends of the second active layer 21B, and the positions of two third via holes correspond to the positions of both ends of the third active layer 21C. The interlayer insulating layer 14, the second gate insulating layer 13 and the first gate insulating layer 12 in the multiple first via holes are etched away to expose a surface of the active layer 21A. The interlayer insulating layer 14, the second gate insulating layer 13 and the first gate insulating layer 12 in the multiple second via holes are etched away to expose a surface of the active layer 21B. The interlayer insulating layer 14, the second gate insulating layer 13 and the first gate insulating layer 12 in the multiple third via holes are etched away to expose a surface of the active layer 21C.

Subsequently, a third metal film is deposited, and the third metal film is patterned by a patterning process to form a source-drain metal layer pattern on the interlayer insulating layer 14. The source-drain metal layer is formed in the display area and includes at least a first source electrode 25A, a first drain electrode 26A, a second source electrode 25B, a second drain electrode 26B, a third source electrode 25C, a third drain electrode 26C, multiple data lines (not shown), and multiple data lead patterns. The first source electrode 25A and the first drain electrode 26A are connected to the first active layer 21A by first via holes, respectively. The first source electrode 25B and the first drain electrode 26B are connected to the second active layer 21B by second via holes, respectively. The first source electrode 25C and the first drain electrode 26C are connected to the third active layer 21C by third via holes, respectively. In an exemplary embodiment, the source-drain metal layer may further include any one or more of a power supply line (VDD), a compensation line, and an auxiliary cathode according to actual needs. The source-drain metal layer is also called a first source-drain metal layer (SD1).

Figure 7B:
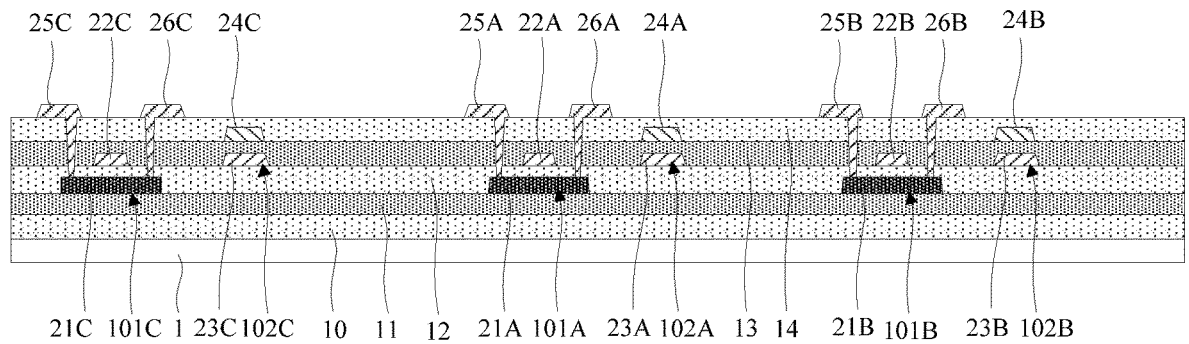
FIG. 7B is a schematic diagram of a display substrate after a drive structure layer is formed according to at least one embodiment of the present disclosure.

So far, the manufacturing of a pattern of the driving structure layer on the base substrate 10 is completed, as shown in FIG. 7B. The first active layer 21A, the first gate electrode 22A, the first source electrode 25A, and the first drain electrode 26A form a first transistor 101A. The second active layer 21B, the second gate electrode 22B, the second source electrode 25B, and the second drain electrode 26B form a second transistor 101B. The third active layer 21C, the third gate electrode 22C, the third source electrode 25C, and the third drain electrode 26C form a third transistor 101C. The first capacitor electrode 23A and the fourth capacitor electrode 24A form a first storage capacitor 102A. The second capacitor electrode 23B and the fifth capacitor electrode 24B form a second storage capacitor 102B. The third capacitor electrode 23C and the sixth capacitor electrode 24C form a third storage capacitor 102C. The multiple gate leads and data leads constitute the driving leads of Gate Driver on Array (GOA). In an exemplary embodiment, the first transistor 101A may be a driving transistor in a pixel driving circuit of a sub-pixel of first color, the second transistor 101B may be a driving transistor in a pixel driving circuit of a sub-pixel of second color, and the third transistor 101C may be a driving transistor in a pixel driving circuit of a sub-pixel of third color. However, this embodiment is not limited thereto.

In some exemplary embodiments, the buffer layer 11, the first gate insulating layer 12, the second gate insulating layer 13 and the interlayer insulating layer 14 may be made of any one or more of silicon oxide (SiOx), silicon nitride (SiNx) and silicon oxynitride (SiON), and may be a single layer, multiple layers or a composite layer. The first metal film, the second metal film and the third metal film may be made of a metallic material, such as any one or more of silver (Ag), copper (Cu), aluminum (Al), titanium (Ti) and molybdenum (Mo), or an alloy material of the above metals, such as aluminum-neodymium alloy (AlNd) or molybdenum-niobium alloy (MoNb), which may be a single-layer structure or multi-layer composite structure, such as Ti/Al/Ti. The active layer thin film may be made of a material such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology and organics technology.

(3) Forming a First Planarization (PLN) Layer on the Base Substrate on which the Aforementioned Patterns are Formed.

Figure 7C:
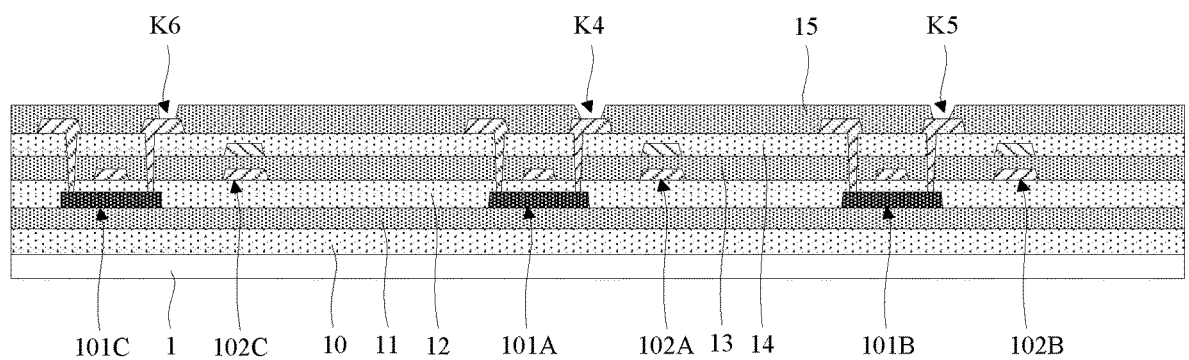
FIG. 7C is a schematic diagram of a display substrate after a first planarization layer is formed according to at least one embodiment of the present disclosure.

In some exemplary embodiments, a thin film of an organic material is coated on the base substrate 10 on which the aforementioned patterns are formed, to form a first planarization layer 15 covering the entire base substrate 10, and form multiple fourth via holes, multiple fifth via holes, and multiple sixth via holes on the first planarization layer 15 by a patterning process (only one fourth via hole K4, one fifth via hole K5, and one sixth via hole K6 are shown in FIG. 7C). As shown in FIG. 7C, the first planarization layer 15 in the fourth via K4 is etched away to expose a surface of the first drain electrode of the first transistor 101A, the first planarization layer 15 in the fifth via K5 is etched away to expose a surface of the second drain electrode of the second transistor 101B, and the first planarization layer 15 in the sixth via K6 is etched away to expose a surface of the third drain electrode of the third transistor 101C.

(4) Forming at Least One Convex Structure on the Base Substrate on which the Aforementioned Patterns are Formed.

Figure 7D:
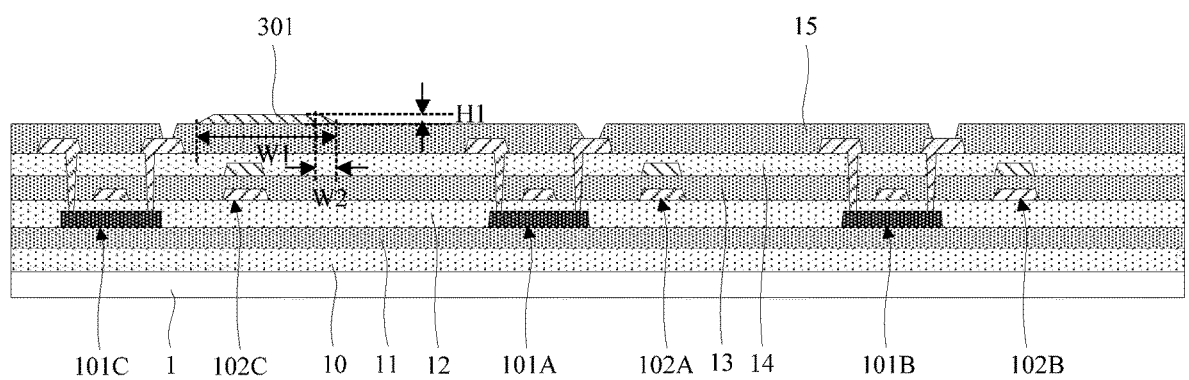
FIG. 7D is a schematic diagram of a display substrate after a convex structure is formed according to at least one embodiment of the present disclosure.

In some exemplary embodiments, a fourth metal film is deposited on the base substrate 10 on which the aforementioned patterns are formed, and the fourth metal film is patterned by a patterning process (e.g., a wet etching process) to form at least one convex structure, such as the first bump 301. As shown in FIG. 7D, an orthographic projection of the first bump 301 on the base substrate 10 may be located in the light-emitting area of the sub-pixel of third color, that is, an overlapping area of the light-emitting element of the sub-pixel of third color and the first bump 301 formed subsequently may be located in the light-emitting area of the sub-pixel of third color. As shown in FIG. 7D, in a plane perpendicular to the display substrate, the first bump 301 may be trapezoidal, the top surface and the bottom surface are mutually parallel planes, the top surface and the bottom surface are connected by a slope surface, and the slope surface is a plane.

In some examples, as shown in FIG. 7D, a first width W1 of the first bump 301 may be about 7.5 μm; and a distance (i.e., the first thickness H1) between the top surface of the first bump 301 and the ground surface may be about 0.5 μm. However, this embodiment is not limited thereto.

In some exemplary embodiments, the first bump 301 may be provided in the same layer as an electrostatic shielding layer in the non-display area around the display area, thereby enabling multiple utilizations of the process means and optimizing the manufacturing process. However, this embodiment is not limited thereto.

In some exemplary embodiments, the fourth metal film may be made of a metallic material, such as one or more of silver (Ag), Copper (Cu), Aluminum (Al), Titanium (Ti), and Molybdenum (Mo). Exemplarily, the fourth metal film may be made of molybdenum (Mo).

In this exemplary embodiment, controllable adjustment of the range and topography of the first bump may be achieved by adjusting the etching time of the fourth metal film and the thickness of the fourth metal film, and the etching pattern of the fourth metal film may be optimized in detail by designing an exposure mask (Mask). However, this embodiment is not limited thereto.

(5) Forming a Pattern of a First Electrode on the Base Substrate on which the Aforementioned Patterns are Formed, Wherein the First Electrode is a Total Reflective Anode, and the First Electrode is Connected to the Corresponding Pixel Driving Circuit.

Figure 7E:
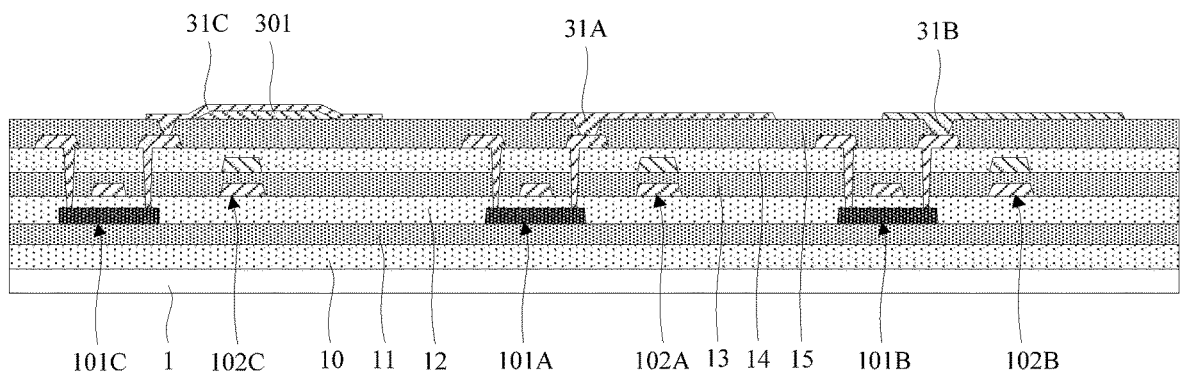
FIG. 7E is a schematic diagram of a display substrate after a first electrode is formed according to at least one embodiment of the present disclosure.

In some exemplary embodiments, a conductive thin film is deposited on the base substrate 10 on which the aforementioned patterns are formed, and the conductive thin film is patterned by a patterning process to form a pattern of the first electrode. As shown in FIG. 7E, the first electrode pattern includes at least a first anode 31A, a second anode 31B and a third anode 31C. The first anode 31A of the sub-pixel of first color is connected to the first drain electrode of the first transistor 101A by a fourth via hole, the second anode 31B of the sub-pixel of second color is connected to the second drain electrode of the second transistor 101B by a fifth via hole, and the third anode 31C of the sub-pixel of third color is connected to the third drain electrode of the third transistor 101C by a sixth via hole. The third anode 31C of the sub-pixel of third color is in direct contact with the first bump 301, i.e., there is an electrical connection between the third anode 31C and the first structure. An orthographic projection of the third anode 31C on the base substrate 10 may include an orthographic projection of the first bump 301 on the base substrate 10. An orthographic projection of the first bump 301 on the base substrate 10 and an projection of the sixth via hole on the base substrate 10 may not overlap. That is, the third anode 31C is electrically connected to the third drain electrode of the third transistor 101C by the sixth via hole, and the first bump 301 does not affect the electrical connection between the third anode 31C and the third drain electrode of the third transistor 101C. However, this embodiment is not limited thereto. For example, projections of the first bump and the sixth via hole on the base substrate may overlap, i.e., the third anode may be electrically connected to the third drain electrode of the third transistor of the pixel driving circuit by means of the first bump. In this example, the first bump 301 is made of a metallic material, and the first bump 301 is in direct contact with the third anode 31C, which has a function of reducing the series resistance and is beneficial to improving the electrical connection effect between the third anode 31C and the third drain electrode of the third transistor 101C.

In this exemplary embodiment, by forming the third anode 31C on a side of the first bump 301 away from the base substrate 10, the topography of the third anode 31C is influenced by the first bump 301, thereby forming a non-planar structure (for example, a convex structure), and the position and shape of the non-planar structure of the third anode 31C matches the position and shape of the first bump 301. An orthographic projection of the third anode 31C on the base substrate 10 overlays an orthographic projection of the first bump 301 on the base substrate 10. In this example, a protruding area of the non-planar structure of the third anode 31C corresponds to the position where the first bump 301 is located, and a protruding height of the non-planar structure of the third anode 31C is determined by a thickness of the first bump 301. The non-planar design of the third anode of the sub-pixel of third color is realized by adopting the first bump of the metallic material, the manufacturing method is simple, and the multi-dimensional controllable adjustment of the topography of the third anode may be realized by controlling the pattern density, etching time and thickness of the metal film, so that the non-planar effect of the third anode may be finely adjusted.

In some examples, the first electrode may be made of a metallic material, such as any one or more of Magnesium (Mg), Argentum (Ag), Copper (Cu), Aluminum (Al), Titanium (Ti) and Molybdenum (Mo), or alloy materials of the above-mentioned metals, such as an Aluminum-Neodymium alloy (AlNd) or a Molybdenum-Niobium alloy (MoNb), and may be of single-layer structures, or multilayer composite structures such as Ti/Al/Ti, or stacked structures formed by metals and transparent conductive materials such as Indium Tin Oxide (ITO)/Ag/ITO, Mo/AlNd/ITO and other reflective materials.

(6) Forming a Pixel Definition Layer (PDL) Layer, an Organic Light-Emitting Layer, and a Second Electrode on the Base Substrate on which the Aforementioned Patterns are Formed.

Figure 7F:
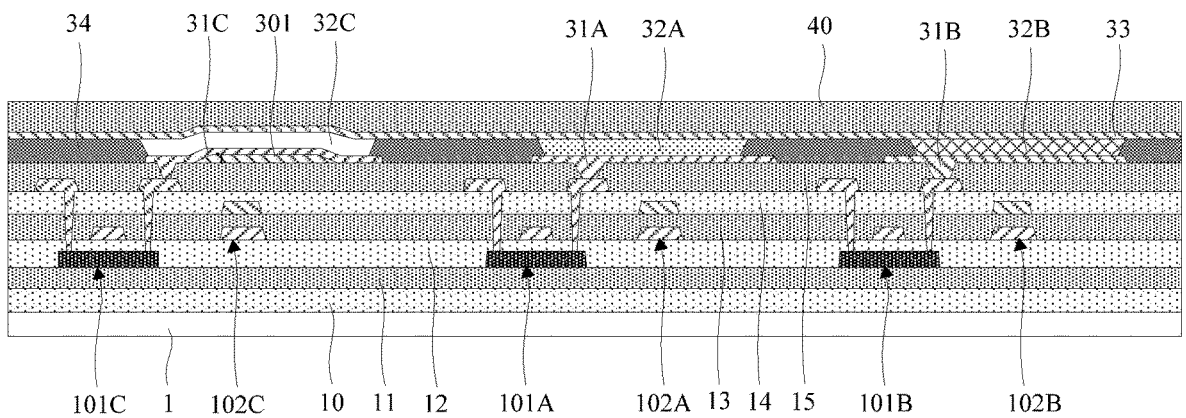
FIG. 7F is a schematic diagram of a display substrate after an encapsulation layer is formed according to at least one embodiment of the present disclosure.

In some exemplary embodiments, a pixel definition film is coated on the base substrate on which the aforementioned patterns are formed, and a pattern of the pixel definition layer is formed by masking, exposure, and development processes. As shown in FIG. 7F, the pixel definition layer 34 in the display area is provided with multiple pixel openings. The pixel definition layer 34 in the multiple pixel openings is developed away to expose at least part of a surface of the first anode 31A, at least part of a surface of the second anode 31B, and at least part of a surface of the third anode 31C, respectively. Portions of the light-emitting element located at the pixel openings are used for emitting light, and the pixel opening corresponds to a light-emitting area of the light-emitting element.

In some exemplary embodiments, the organic light-emitting layer may include a hole injection layer, a hole transport layer, a light-emitting layer, an electron transport layer and an electron injection layer which are stacked. The organic light-emitting layer is formed in a pixel opening of the display area to realize the connection of the organic light-emitting layer to the first electrode (for example, the first organic light-emitting layer 32A is connected to the first anode 31A, the second organic light-emitting layer 32B is connected to the second anode 31B, and the third organic light-emitting layer 32C is connected to the third anode 31C), and the second electrode 33 is formed on the pixel definition layer 34 to be connected to the organic light-emitting layer. In some examples, the hole injection layer and the hole transport layer are formed by sequentially evaporating on the base substrate 10 on which the aforementioned patterns are formed using an Open Mask, then a blue light-emitting layer, a green light-emitting layer and a red light-emitting layer are formed by sequentially evaporating using FMM, and then an electron transport layer, an electron injection layer and a second electrode are formed by sequentially evaporating using an open mask.

In some exemplary embodiments, the pixel definition layer 34 may be made of an organic material such as polyimide, acrylic, or polyethylene terephthalate.

In some exemplary embodiments, the second electrode 33 is a semi-reflective cathode or a transparent cathode. The light reflected by the first electrode is emitted from a side away from the base substrate 10 through the second electrode 33 to achieve top emission light. In some examples, an optical coupling layer may be formed at a side of the second electrode away from the base substrate. The optical coupling layer may be a common layer of multiple sub-pixels. The optical coupling layer may cooperate with the second electrode so as to increase a light output. For example, a material of the optical coupling layer may be a semiconductor material. However, this embodiment is not limited thereto.

In some exemplary embodiments, the second electrode 33 may be made of any one or more of magnesium (Mg), silver (Ag) and aluminum (Al), or an alloy made of any one or more of the above metals, or a transparent conductive material, such as indium tin oxide (ITO), or a multilayer composite structure of metals and transparent conductive materials.

(7) Forming an Encapsulation Layer on the Base Substrate on which the Aforementioned Patterns are Formed.

In some exemplary embodiments, as shown in FIG. 7F, the encapsulation layer 40 may be an inorganic/organic/inorganic three-layer structure to complete encapsulation of the display substrate. However, this embodiment is not limited thereto. In some examples, the encapsulation layer made be an inorganic/organic/inorganic/organic/inorganic five-layer structure.

After the above operations, the base substrate 10 is removed from the glass carrier plate 1 using a laser peeling process to obtain the display substrate of this exemplary embodiment.

According to the display substrate of this exemplary embodiment, since a first structure is provided on a side of a reflective anode of a blue sub-pixel close to the base substrate, and the first structure includes a first bump made of a metallic material, the reflective anode of the blue sub-pixel forms a non-planar structure (such as a convex structure), so as to adjust the light emission spectrum of the blue sub-pixel to change with the viewing angle, thereby effectively improving the color cast without affecting the front display color gamut of the display substrate. By forming a convex structure on the emitting anode of the blue sub-pixel, the light output of the blue sub-pixel to the non-positive viewing angle may be increased, so that the decay of brightness with the viewing angle is slowed down, thus improving the matching with the viewing angle characteristics of the red sub-pixel and the green sub-pixel.

The display substrate of the exemplary embodiment of the present disclosure may effectively improve the view angle color cast of the display substrate, expand the material selection of the light-emitting element and the adjustment space of the film thickness, and has great application and mass production value, without adding additional process and cost and complicating the manufacturing process. The manufacturing process of the present exemplary embodiment may be implemented using an existing mature manufacture device, and is compatible well with an existing manufacturing process, simple in process implementation, easy to implement, high in production efficiency and yield, and low in production cost.

The structure of the display substrate of the embodiment of the present disclosure and the manufacturing process thereof are described only as an example. In some exemplary embodiments, changes in corresponding structures and, addition or deletion of patterning processes may be made according to actual needs. For example, the display substrate may further include a second source-drain metal layer, the second source-drain metal layer may include multiple connection electrodes, and the first electrode may be connected to a transistor of the pixel driving circuit through the connection electrodes. For another example, the organic light-emitting layer may further include at least one of an electron block layer, a hole block layer, and an electron injection layer. For another example, the hole transport layer and the hole injection layer of the organic light-emitting layer of the light-emitting element may be provided as common layers. However, the embodiment of the present disclosure is not limited to this.

Figure 8:
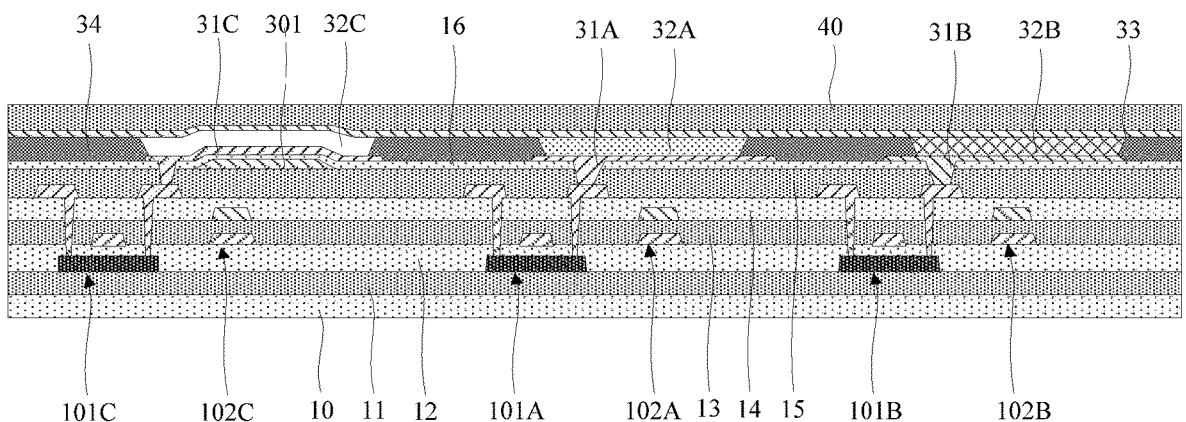
FIG. 8 is another schematic sectional view along a P-P direction in FIG. 2.

FIG. 8 is another schematic sectional view along a P-P direction in FIG. 2. In some exemplary embodiments, as shown in FIG. 8, the first structure may include at least one convex structure (e.g., a first bump 301) and a second insulating layer 16. The second insulating layer 16 is located between the convex structure and the first electrode. The first structure is located on a side of the first planarization layer 15 away from the base substrate 10. As shown in FIG. 8, in a plane perpendicular to the display substrate, a cross section of the first bump 301 may be trapezoidal. The second insulating layer 16 is provided with multiple via holes, and the second insulating layer 16 and the first planarization layer 15 in the multiple via holes are etched away, so that the first electrode may be connected to the transistor of the pixel driving circuit through the corresponding via holes. As shown in FIG. 8, the third anode 31C may be connected to the third drain electrode of the third transistor 101C through the via hole on the second insulating layer 16, the first anode 31A may be connected to the first drain electrode of the first transistor 101A through the via hole on the second insulating layer 16, and the second anode 31B may be connected to the second drain electrode of the second transistor 101B through the via hole on the second insulating layer 16. In this example, the first bump 301 may be made of a metallic material, such as molybdenum (Mo). The third anode 31C is in direct contact with the second insulating layer 16 and there may be no electrical connection between the third anode 31C and the first bump 301. The first bump 301 is only used to adjust the topography of the third anode 31C. A thickness of the second insulating layer 16 may be less than a thickness of the planarization layer 15, to avoid the first bump 301 from being planarized by the second insulating layer 16, so that the topography of the third anode 31C may be adjusted by the first bump 301. In some examples, the second insulating layer 16 may be made of an inorganic material or an organic material. However, this embodiment is not limited thereto.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 9:
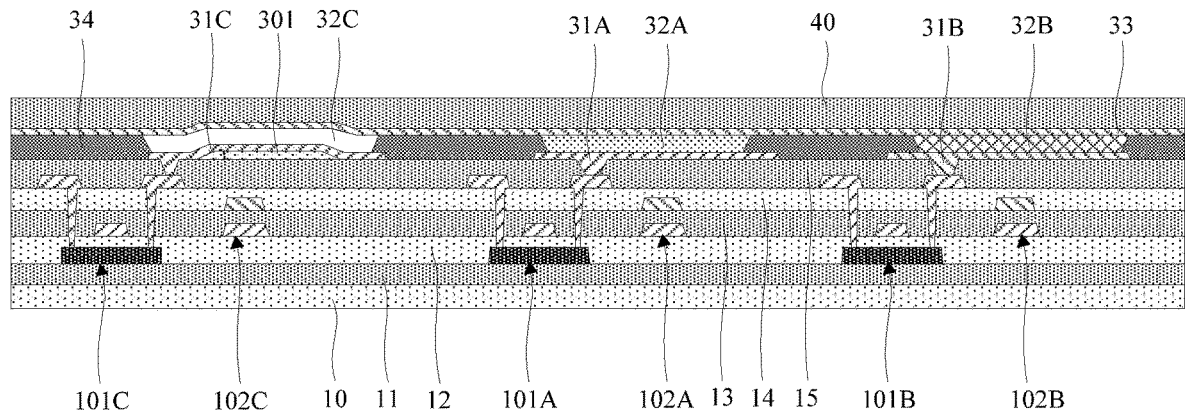
FIG. 9 is another schematic sectional view along a P-P direction in FIG. 2.

FIG. 9 is another schematic sectional view along a P-P direction in FIG. 2. In some exemplary embodiments, as shown in FIG. 9, the first structure may include a first planarization layer 15 and at least one convex structure (e.g., a first bump 301). The first planarization layer 15 is the first insulating layer. In this example, a surface of the first planarization layer 15 on a side close to the convex structure may be flat. The first planarization 15 is located on a side of the driving structure layer away from the base substrate 10, and the first bump 301 is located on a side of the first planarization 15 away from the base substrate 10. In this example, taking the first bumps 301 shown in FIG. 9 as an example, a cross section of the first bump 301 may be trapezoidal in a plane perpendicular to the display substrate. The first bump 301 may be made of a photosensitive organic material such as a photoresist.

In some examples, after forming the first planarization layer 15, a layer of photoresist may be coated on the first planarization layer 15, and a photoresist pattern is formed after exposing and developing the photoresist using a Halftone Mask. The photoresist pattern may include an unexposed area, a partially exposed area and a fully exposed area. The unexposed area includes a position where a top surface of the first bump 301 is located. The partially exposed area includes a position where a slope surface of the first bump 301 is located, and a thickness of the photoresist of the partially exposed area is less than that of the photoresist of the unexposed area. The remaining area is the fully exposed area, and the photoresist of the fully exposed area is completely removed, exposing a surface of the first planarization layer 15. A thickness of the coated photoresist may be about 100 nm to 500 nm. By adjusting the exposure intensity, the partially exposed area may be exposed for many times to form a slope surface. However, this embodiment is not limited thereto.

In some examples, in a plane perpendicular to the display substrate, a distance between a top surface and a bottom surface of the first bump 301 may be about 0.32 µm, and a width of the slope surface of the first bump 301 may be about 2.43 µm. However, this embodiment is not limited thereto.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 10:
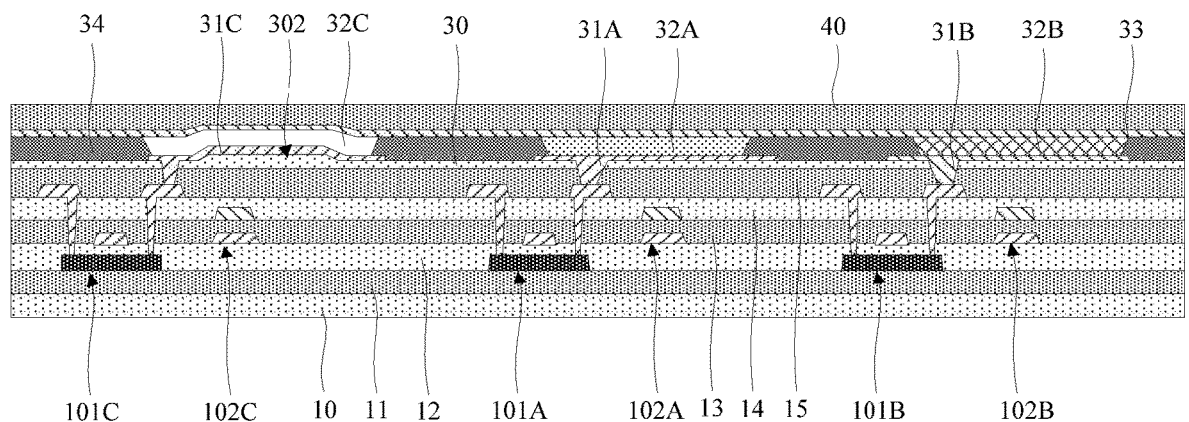
FIG. 10 is another schematic sectional view along a P-P direction in FIG. 2.

FIG. 10 is another schematic sectional view along a P-P direction in FIG. 2. In some exemplary embodiments, as shown in FIG. 10, the first structure 30 is located between the first planarization layer 15 and the first electrode of the light-emitting element. The first structure 30 includes a flat portion and at least one non-flat portion. In this example, the non-flat portion may be a convex structure. In this example, the convex structure is exemplified by a first protrusion 302 shown in FIG. 10, which is located on a surface of the flat portion of the first structure 30 on a side away from the base substrate 10. An orthographic projection of the first structure 30 on the base substrate may include an orthographic projection of the first electrode on the base substrate 10. An orthographic projection of the third anode 31C on the base substrate 10 may include an orthographic projection of the first protrusion 302 on the base substrate 10. In this example, the first structure 30 may be made of organic material. The first structure 30 is provided with multiple via holes, and the first structure 30 and the first planarization layer 15 in the multiple via holes are etched away, so that the first electrode may be connected to the transistor of the pixel driving circuit through the corresponding via holes. As shown in FIG. 10, the third anode 31C may be connected to the third drain electrode of the third transistor 101C through the via hole on the first structure 30, the first anode 31A may be connected to the first drain electrode of the first transistor 101A through the via hole on the first structure 30, and the second anode 31B may be connected to the second drain electrode of the second transistor 101B through the via hole on the first structure 30. The convex structure of the first structure 30 made of an organic material may adjust the topography of the third anode 31C so that the third anode 31 forms a non-planar structure (e.g., a convex structure matching the shape and position of the first protrusion 302). In some examples, while the first structure 30 is formed in the display area using an organic material, an insulating barrier layer may be formed in a peripheral area, thereby enabling multiple utilizations of the process means and optimizing the manufacturing process. However, this embodiment is not limited thereto.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 11:
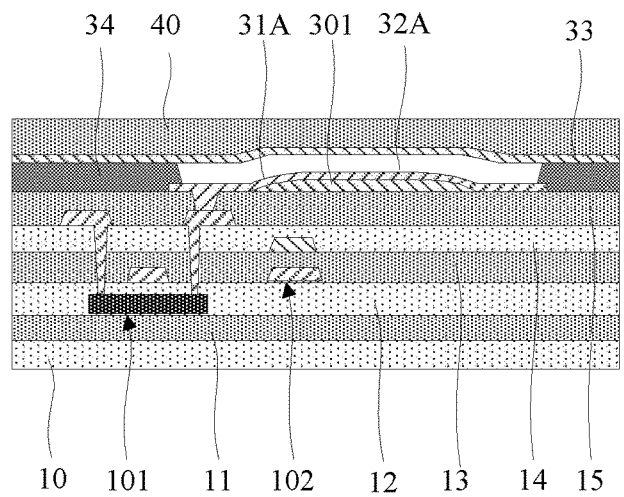
FIG. 11 is a schematic partial sectional view along a P-P direction in FIG. 2.

FIG. 11 is a schematic partial sectional view along a P-P direction in FIG. 2. FIG. 11 only shows a schematic sectional view of the sub-pixel of third color, and cross-sectional structures of the sub-pixel of first color and the sub-pixel of second color are omitted. In some exemplary embodiments, as shown in FIG. 11, the first structure may include a first planarization layer 15 and at least one convex structure between the first planarization layer 15 and the first electrode of the light-emitting element. In this example, the convex structure is exemplified by a first convex 301 shown in FIG. 11. In a plane perpendicular to the display substrate, the first convex 301 has a top surface and a bottom surface parallel to each other, and a slope surface connected to the top surface and the bottom surface, and the slope surface is an arc surface. In other words, the top surface and the bottom surface of the first bump 301 are connected by an arc surface. In some examples, the first bump 301 may be made of a metallic material or a photosensitive organic material. However, this embodiment is not limited thereto. The first bump 301 may adjust the topography of the third anode 31C so that the third anode 31 forms a convex structure matching the shape and position of the first bump 301.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 12:
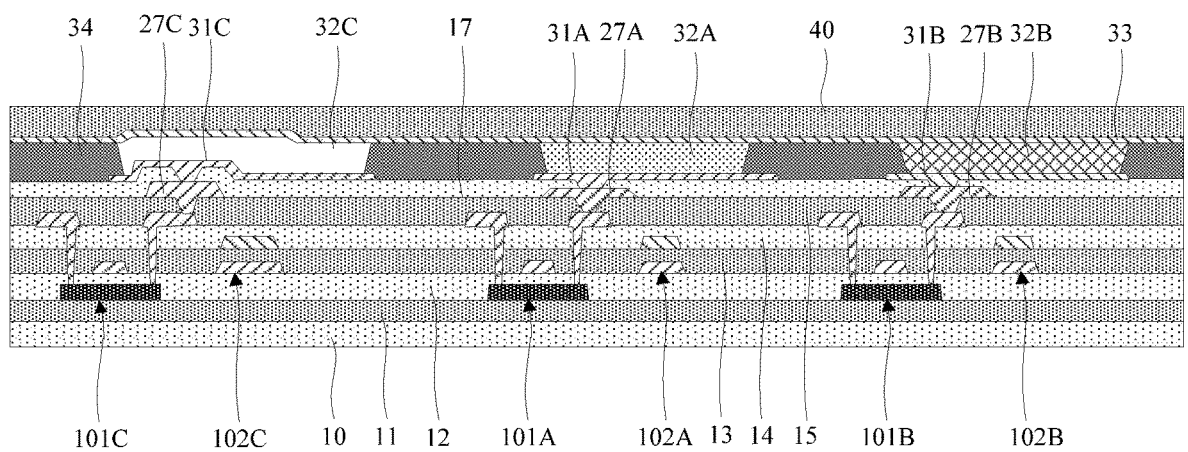
FIG. 12 is another schematic sectional view along a P-P direction in FIG. 2.

FIG. 12 is another schematic sectional view along a P-P direction in FIG. 2. In some exemplary embodiments, as shown in FIG. 12, in the plane perpendicular to the display substrate, the pixel driving circuit of the driving structure layer includes: an active layer, a first gate metal layer, a second gate metal layer, a first source-drain metal layer and a second source-drain metal layer that are sequentially provided on the base substrate. A first gate insulating layer 12 is provided between the active layer and the first gate metal layer, a second gate insulating layer 13 is provided between the first gate metal layer and the second gate metal layer, an interlayer insulating layer 14 is provided between the second gate metal layer and the first source-drain metal layer, and a first planarization layer 15 is provided between the first source-drain metal layer and the second source-drain metal layer. A second planarization layer 17 made of an organic material is provided between the second source-drain metal layer and the first electrode. A thickness of the second planarization layer 17 is less than that of the first planarization layer 15. The thickness of the second planarization layer 17 may be less than or equal to 2 μm, for example, may be about 1.5 μm. The second source-drain metal layer includes at least a first connection electrode 27A, a second connection electrode 27B, and a third connection electrode 27C. The first anode 31A is connected to the first drain electrode of the first transistor 101A through the first connection electrode 27A, the second anode 31B is connected to the second drain electrode of the second transistor 101B through the second connection electrode 27B, and the third anode 31C is connected to the third drain electrode of the third transistor 101C through the third connection electrode 27C.

In this exemplary embodiment, the first structure may include a second planarization layer 17. By increasing a thickness of the second source-drain metal layer of the pixel driving circuit of the sub-pixel of third color, the second planarization layer 17 cannot realize planarization among multiple sub-pixels, and the second planarization layer 17 forms a convex structure, thereby changing the topography of the third anode. A thickness of the second source-drain metal layer of the pixel driving circuit of the sub-pixel of first color is approximately equal to a thickness of the second source-drain metal layer of the pixel driving circuit of the sub-pixel of second color, and a thickness of the second source-drain metal layer of the pixel driving circuit of the sub-pixel of third color is greater than a thickness of the second source-drain metal layer of the pixel driving circuit of the sub-pixel of first color. For example, the thickness of the second source-drain metal layer of the sub-pixel of third color may be about 300 nm to 800 nm. As shown in FIG. 12, a thickness of the third connection electrode 27C is greater than that of the first connection electrode 27A and also greater than that of the second connection electrode 27B. However, this embodiment is not limited thereto.

In this exemplary embodiment, on the basis of thinning the second planarization layer, the thickness of the second source-drain metal layer of the sub-pixel of third color is increased, the second planarization layer is unable to realize planarization among multiple sub-pixels, so that the second planarization layer forms a convex structure, thereby changing the topography of the third anode of the sub-pixel of third color. The display substrate of the exemplary embodiment of the present disclosure may effectively improve the case that the brightness of the blue sub-pixel decays too fast with the viewing angle without adding additional processes and costs.

In some exemplary embodiments, the first structure may include a second planarization layer. By increasing the overlapping area of the orthographic projections of the first source-drain metal layer and the second source-drain metal layer of the pixel driving circuit of the sub-pixel of third color on the base substrate and making the thicknesses of both the first planarization layer and the second planarization layer less than 2 μm, a surface of the second planarization layer on a side close to the first electrode is uneven. The overlapping area of the orthographic projections of the first source-drain metal layer and the second source-drain metal layer of the pixel driving circuit of the sub-pixel of third color on the base substrate may be greater than the overlapping area of the orthographic projections of the first source-drain metal layer and the second source-drain metal layer of the pixel driving circuit of the sub-pixel of first color on the base substrate, and the overlapping area of the orthographic projections of the first source-drain metal layer and the second source-drain metal layer of the pixel driving circuit of the sub-pixel of first color on the base substrate may be approximately equal to the overlapping area of the orthographic projections of the first source-drain metal layer and the second source-drain metal layer of the pixel driving circuit of the sub-pixel of second color on the base substrate. An orthographic projection of the third anode of the sub-pixel of third color on the base substrate overlaps with the overlapping area of the first source-drain metal layer and the second source-drain metal layer on the base substrate.

Figure 13:
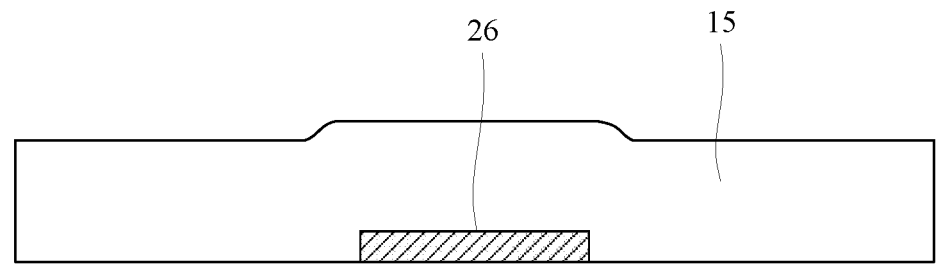
FIG. 13 is a schematic diagram of forming a convex structure by thinning a first planarization layer and a second planarization layer according to at least one embodiment of the present disclosure.
Figure 13:
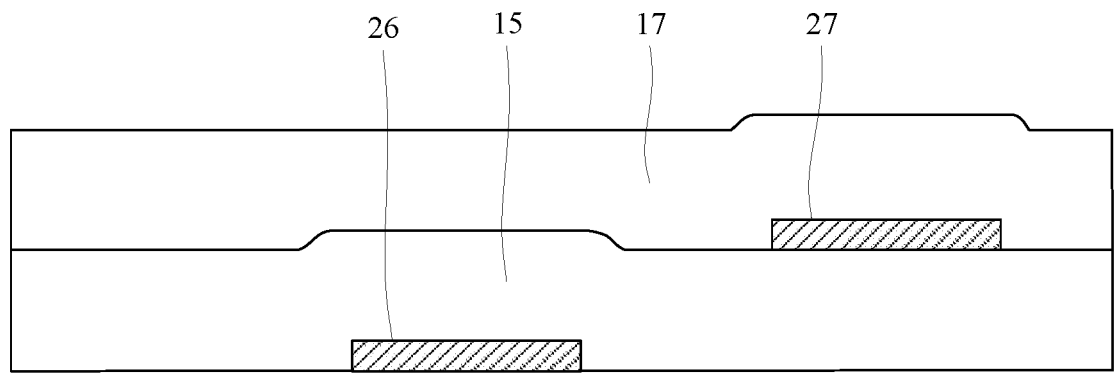
Figure 13:
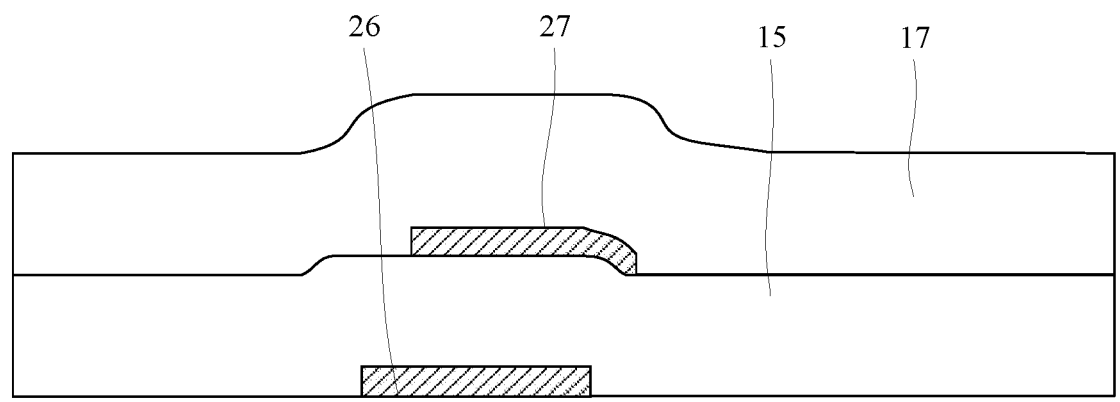

FIG. 13 is a schematic diagram of forming a convex structure by thinning a first planarization layer and a second planarization layer according to at least one embodiment of the present disclosure. As shown in FIG. 13(a), after the first planarization layer 15 is formed on the first source-drain metal layer 26, a protrusion would be formed at a position corresponding to the first source-drain metal layer 26 when the planarization of the first source-drain metal layer 26 cannot be achieved at the thickness of the first planarization layer 15. As shown in FIG. 13(b), after the second planarization layer 17 is formed on the second source-drain metal layer 27, a protrusion would be formed at a position corresponding to the second source-drain metal layer 27 when the planarization of the second source-drain metal layer 27 cannot be achieved at the thickness of the second planarization layer 17. When the projections of the first source-drain metal layer 26 and the second source-drain metal layer 27 on the base substrate do not overlap or the overlapping area is small, the protrusions caused by the non-leveling of the first planarization layer 15 and the second planarization layer 17 would not be superimposed or would increase slightly. As shown in FIG. 13(c), when the planarization of the first source-drain metal layer 26 cannot be achieved at the thickness of the first planarization layer 15, the planarization of the second source-drain metal layer 27 cannot be achieved at the thickness of the second planarization layer 17, and the orthographic projections of the first source-drain metal layer 26 and the second source-drain metal layer 27 on the base substrate overlap and the overlapping area is large, the protrusions caused by the non-leveling of the first planarization layer 15 and the second planarization layer 17 would be superimposed, and a convex surface which may change the topography of the first electrode of the light-emitting element is formed.

In this exemplary embodiment, on the basis of thinning the first planarization layer and the second planarization layer, the first planarization layer cannot realize the planarization of the first source-drain metal layer, the second planarization layer cannot realize the planarization of the second source-drain metal layer, and the overlapping area of orthographic projections of the first source-drain metal layer and the second source-drain metal layer of the sub-pixel of third color on the base substrate is increased, so that the protrusions caused by unleveling of the first planarization layer and the second planarization layer are superimposed to form a convex surface which may change the topography of the first electrode of the light-emitting element of the sub-pixel of third color, so as to change the topography of the third anode.

In this exemplary embodiment, on the basis of thinning the first planarization layer and the second planarization layer, the overlapping area of the orthographic projections of the first source-drain metal layer and the second source-drain metal layer of the sub-pixel of third color on the base substrate is increased, so that the protrusions caused by unleveling of the first planarization layer and the second planarization layer are superimposed to change the topography of the third anode of the sub-pixel of third color. The display substrate of the exemplary embodiment of the present disclosure may effectively improve the case that the brightness of the blue sub-pixel decays too fast with the viewing angle without adding additional processes and costs.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate. In some examples, it is possible to increase not only the overlapping area of the orthographic projections of the first source-drain metal layer and the second source-drain metal layer of the pixel driving circuit of the sub-pixel of third color on the base substrate, but also the thickness of the second source-drain metal layer of the pixel driving circuit of the sub-pixel of third color, thereby changing the topography of the third anode of the sub-pixel of third color.

Figure 14:
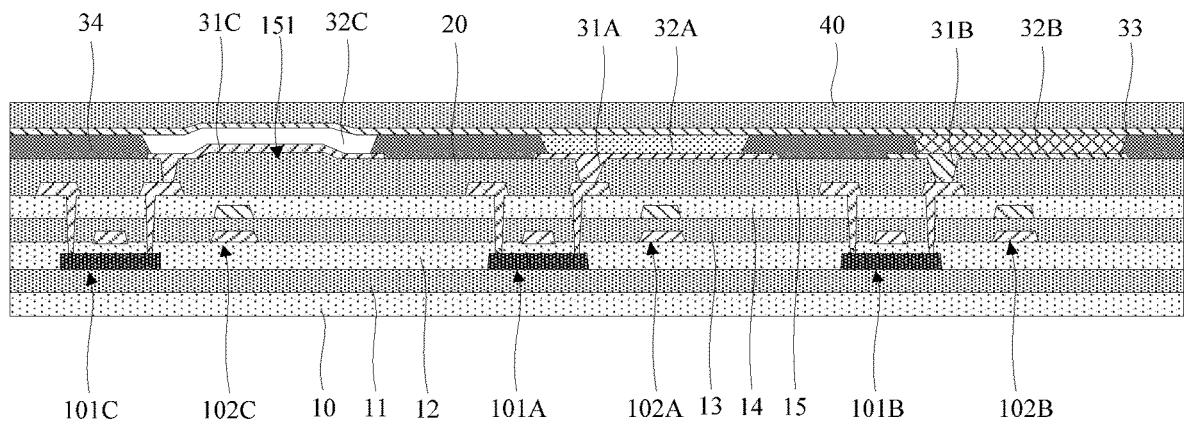
FIG. 14 is another schematic sectional view along a P-P direction in FIG. 2.

FIG. 14 is another schematic sectional view along a P-P direction in FIG. 2. In some exemplary embodiments, as shown in FIG. 14, the first structure is, for example, a first planarization layer 15. A surface of the first planarization layer 15 on a side close to the first electrode has a flat portion and a non-flat portion which may include a convex structure. The first planarization layer 15 is located between the first electrode and the driving structure layer. In this example, the convex structure is exemplified by a second protrusion 151 shown in FIG. 13, which is formed on a surface of a flat portion of the first planarization layer 15 on a side away from the base substrate 10. The topography of the third anode 31C may be adjusted by the convex structure on the first planarization layer 15 to form a convex structure matching the shape and position of the second protrusion 151, while the first anode 31A and the second anode 31B are both planar structures. In this exemplary embodiment, the topography of the third anode 31C of the sub-pixel of third color may be adjusted by the first planarization layer 15 manufactured by an organic material, to adjust the light emission spectrum of the sub-pixel of third color to change with the viewing angle.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 15:
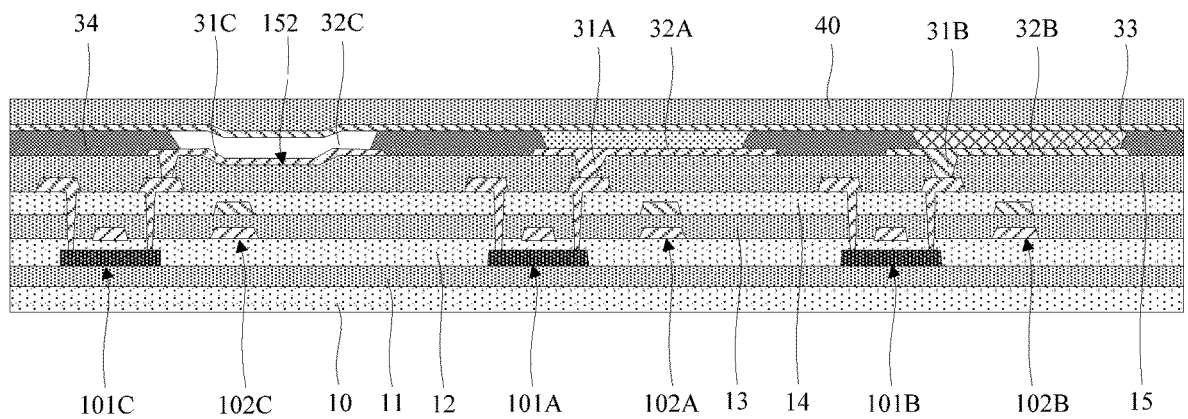
FIG. 15 is another schematic sectional view along a P-P direction in FIG. 2.

FIG. 15 is another schematic sectional view along a P-P direction in FIG. 2. In some exemplary embodiments, as shown in FIG. 15, the first structure is, for example, a first planarization layer 15. A surface of the first planarization layer 15 on a side close to the first electrode has a flat portion and a non-flat portion which may include a concave structure. The first planarization layer 15 is located between the first electrode and the driving structure layer. In this example, the concave structure is exemplified by a first groove 152 shown in FIG. 15, which is formed on a surface of the first planarization layer 15 on a side away from the base substrate 10. The topography of the third anode 31C may be adjusted by the concave structure on the first planarization layer 15 to form a concave structure matching the shape and position of the first groove 152, while the first anode 31A and the second anode 31B are both planar structures.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 16:
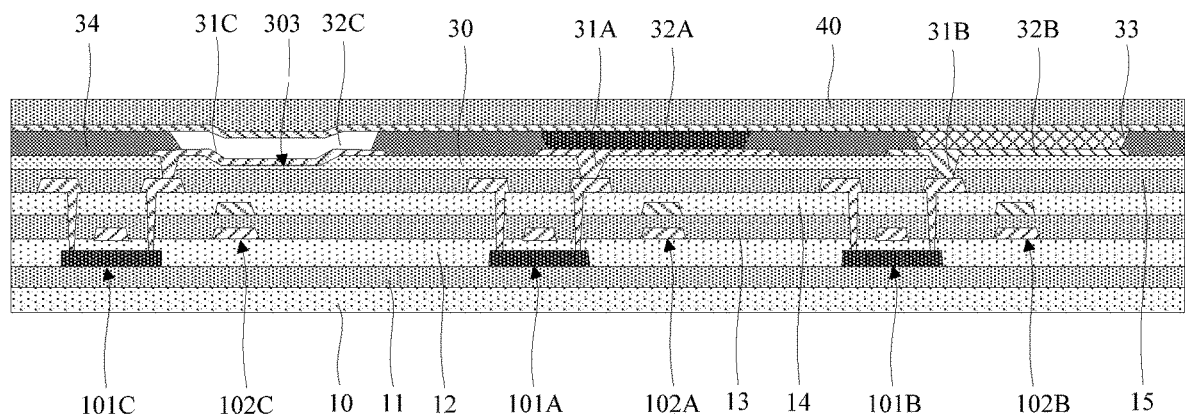
FIG. 16 is another schematic sectional view along a P-P direction in FIG. 2.

FIG. 16 is another schematic sectional view along a P-P direction in FIG. 2. In some exemplary embodiments, as shown in FIG. 16, the first structure 30 is located between the first electrode of the light-emitting element and the first planarization layer 15. The first structure 30 has a flat portion and a non-flat portion, and the non-flat portion may be a concave structure. In this example, the concave structure is exemplified by a second groove 303 shown in FIG. 16, which is located on a surface of the first structure 30 on a side away from the base substrate 10. In this example, the first structure 30 may be made of a photosensitive organic material. In some examples, the first planarization layer 15 and the first structure 30 may be sequentially formed after forming the driving structure layer. The first structure 30 includes the second groove 303 and is provided with multiple via holes, and the first structure 30 and the first planarization layer 15 in the multiple via holes are etched away so that the first electrode may be connected to the transistor of the pixel driving circuit through the corresponding via holes. For example, the third anode 31C may be connected to the third drain electrode of the third transistor 101C through the via hole on the first structure 30, the first anode 31A may be connected to the first drain electrode of the first transistor 101A through the via hole on the first structure 30, and the second anode 31B may be connected to the second drain electrode of the second transistor 101B through the via hole on the first structure 30. The concave structure of the first structure 30 made of an organic material may adjust the topography of the third anode 31C so that the third anode 31 forms a concave structure matching the shape and position of the second groove 303.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 17:
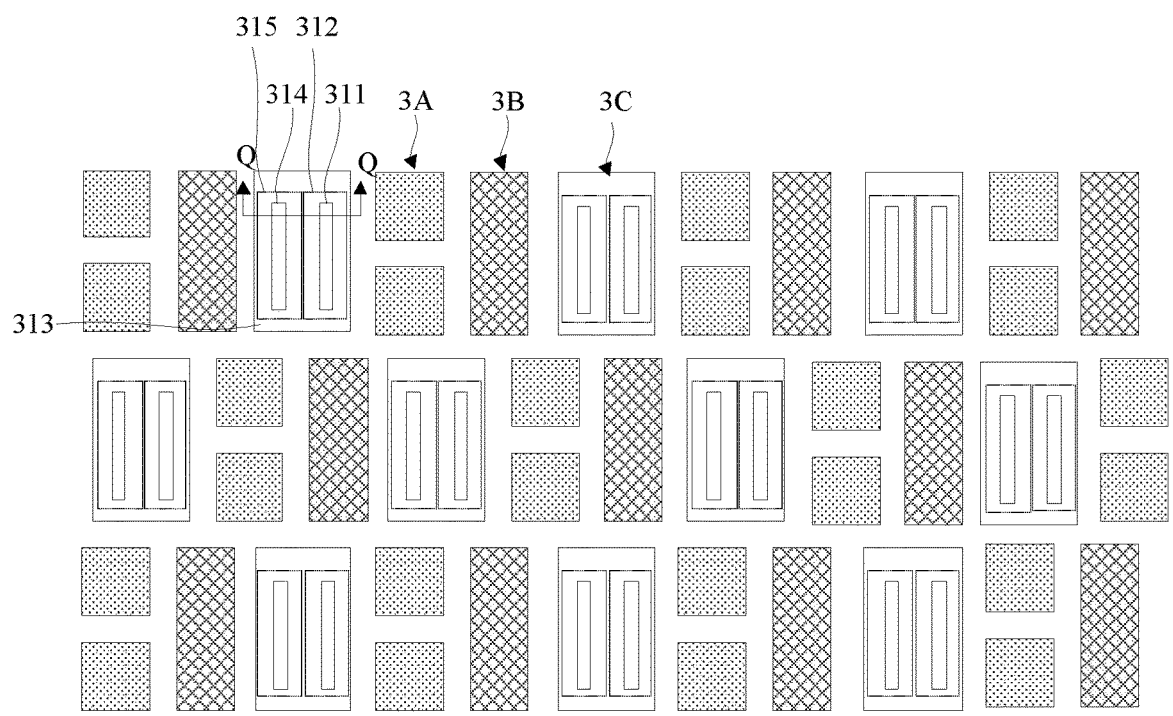
FIG. 17 is another schematic structural diagram of multiple sub-pixels of a display substrate according to at least one embodiment of the present disclosure.

FIG. 17 is another schematic structural diagram of multiple sub-pixels of a display substrate according to at least one embodiment of the present disclosure. FIG. 17 is another partial enlarged schematic diagram of a region S in FIG. 1. In some exemplary embodiments, as shown in FIG.

17, multiple repetitive units are arranged on each row in a plane parallel to the display substrate. Each repetitive unit includes two sub-pixels 3A of a first color, one sub-pixel 3B of a second color, and one sub-pixel 3C of a third color. In one repetitive unit, the sub-pixel 3B of the second color and the sub-pixel 3C of the third color are located on both sides of the two sub-pixels 3A of the first color in the row direction, and the two sub-pixels 3A of the first color are arranged in the column direction. In some examples, the repetitive units between two adjacent rows are shifted in the row direction. For example, the repetitive unit between two adjacent rows has a shift of 1.5 times the width of the sub-pixel 3C of the third color in the row direction. As shown in FIG. 17, in this example, the two sub-pixels 3A of the first color in the repetitive unit are symmetrical to each other and the symmetry axis is parallel to the row direction. The sub-pixels 3A of first color may be rectangular (e.g., rounded rectangular) or square or pentagonal. The sub-pixel 3B of second color and the sub-pixel 3C of third color may both be rectangular (e.g., rounded rectangular) or hexagonal. A length of the sub-pixel 3B of second color in the column direction may be the same as that of the sub-pixel 3C of third color, and a length of the sub-pixel 3A of first color in the column direction is less than a length of the sub-pixel 3B of second color in the column direction. A length of the sub-pixel 3A of first color in the row direction may be greater than or equal to a length of the sub-pixel 3B of second color in the row direction, and a length of the sub-pixel 3C of third color in the row direction may be greater than a length of the sub-pixel 3A of first color in the row direction. In some examples, the sub-pixel 3A of first color may be a green (G) sub-pixel, the sub-pixel 3B of second color may be a red (R) sub-pixel, and the sub-pixel 3C of third color may be a blue (B) sub-pixel. However, shapes and arrangement manner of the multiple sub-pixels in the display area are not limited in this embodiment.

In some exemplary embodiments, as shown in FIG. 17, on a plane parallel to the display substrate, surfaces of the first electrodes of the light-emitting elements of the sub-pixel 3A of first color and the sub-pixel 3B of second color close to the organic light-emitting layer are both planar. A first structure is provided on a side of the first electrode of the light-emitting element of the sub-pixel 3C of third color close to the base substrate, and a surface of the first structure close to the first electrode is uneven, such that a surface of the first electrode of the light-emitting element of the sub-pixel 3C of third color close to the organic light-emitting layer has a non-planar structure. An orthographic projection of the first structure on the base substrate on a side of the first electrode of the light-emitting element of the sub-pixel 3C of third color close to the base substrate overlaps with an orthographic projection of a light-emitting area of the light-emitting element of the sub-pixel 3C of third color on the base substrate. For example, the first structure includes at least two convex structures, and an projection of the light-emitting area of the light-emitting element of the sub-pixel 3C of third color on the base substrate includes orthographic projections of the two convex structures of the first structure on the base substrate. However, this embodiment is not limited thereto. For example, the first structure may include a convex structure and a concave structure, and an orthographic projection of the light-emitting area of the light-emitting element of the sub-pixel 3C of third color on the base substrate may include orthographic projections of the convex structure and the concave structure of the first structure on the base substrate.

In some examples, as shown in FIG. 17, the first structure on a side of the first electrode of the light-emitting element of the sub-pixel 3C of third color close to the base substrate may include a first planar region 311, a first slope region 312, a second planar region 313, a third planar region 314, and a second slope region 315. Orthographic projections of the first planar region 311 and the third planar region 314 on the base substrate may be rectangular. The first slope region 312 surrounds the first planar region 311, and an orthographic projection of the first slope region 312 on the base substrate may be a rectangular ring. The second slope region 315 surrounds the third planar region 314, and an orthographic projection of the second slope region 315 on the base substrate may be a rectangular ring. The second planar region 313 may surround the first slope region 312 and the second slope region 315. However, this embodiment is not limited thereto. For example, the orthographic projection of the first planar region 311 on the base substrate may be circular, elliptical, or other irregular patterns, and the orthographic projections of the first slope region 312 and the second planar region 313 on the base substrate may be circular, elliptical, or other shaped ring. In this example, the first planar region 311, the second planar region 313, and the third planar region 314 are parallel to each other, the first slope region 312 is connected to the first planar region 311 and the second planar region 313, and the second slope region 315 is connected to the second planar region 313 and the third planar region 314.

In some examples, in a plane perpendicular to the display substrate, a distance between the first planar region 311 and the base substrate may be greater than a distance between the second planar region 313 and the base substrate, a distance between the third planar region 314 and the base substrate may be greater than a distance between the second planar region 313 and the base substrate, and a distance between the first planar region 311 and the base substrate may be greater than or equal to or less than a distance between the third planar region 314 and the base substrate. Alternatively, in some examples, in a plane perpendicular to the display substrate, a distance between the first planar region 311 and the base substrate may be less than a distance between the second planar region 313 and the base substrate, and a distance between the third planar region 314 and the base substrate may be greater than a distance between the second planar region 313 and the base substrate. Alternatively, in a plane perpendicular to the display substrate, a distance between the first planar region 311 and the base substrate may be less than a distance between the second planar region 313 and the base substrate, a distance between the third planar region 314 and the base substrate may be small than a distance between the second planar region 313 and the base substrate, and a distance between the first planar region 311 and the base substrate may be greater than or equal to or less than a distance between the third planar region 314 and the base substrate.

In some examples, as shown in FIG. 17, within the sub-pixel of third color, two non-planar structures of the first structure are arranged sequentially in the row direction of the sub-pixels. However, this embodiment is not limited to the arrangement and density of the non-planar structures of the first structure. For example, within one sub-pixel, multiple non-planar structures of the first structure may be sequentially arranged in the column direction of the sub-pixels. In this exemplary embodiment, by controlling the number of non-planar structures of the first structure within a sub-pixel, a proportion adjustment of the planar region and the slope region of the first electrode may be realized and an area proportion of the slope region may be effectively controlled, thereby realizing fine adjustment of the viewing angle brightness and color cast of the sub-pixel.

Figure 18:
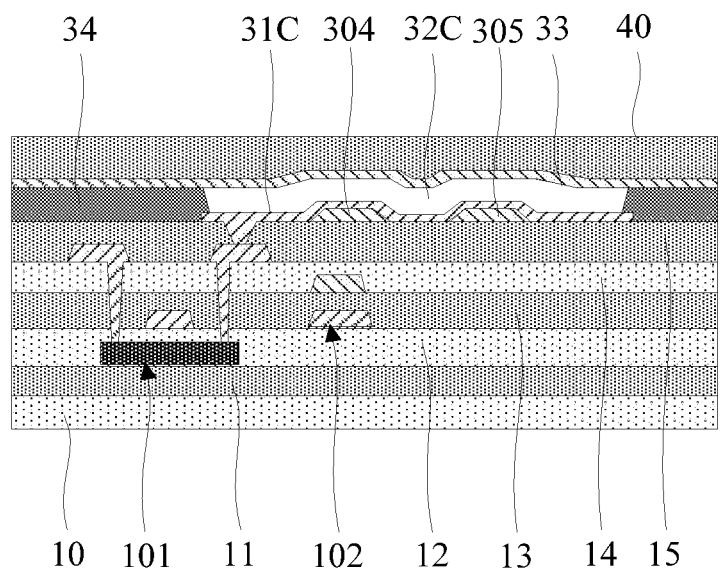
FIG. 18 is a schematic sectional view along a Q-Q direction in FIG. 17.

FIG. 18 is a schematic sectional view along a Q-Q direction in FIG. 17. In some exemplary embodiments, as shown in FIG. 18, a first structure is provided on a side of the drive structure layer away from the base substrate 10 in a plane perpendicular to the display substrate. The first structure includes a first planarization layer 15 and a convex structure located on a side of the first planarization layer 15 away from the base substrate 10. An orthographic projection of the convex structure of the first structure on the base substrate 10 overlaps with the light-emitting area of the sub-pixel of third color. For example, the orthographic projection of the convex structure on the base substrate 10 is located in the light-emitting area of the sub-pixel of third color. The convex structure of the first structure is configured such that the first electrode of the light-emitting element of the sub-pixel of third color forms a non-planar structure. In this example, the first structure has two convex structures in the light-emitting area corresponding to the sub-pixel of third color, the two convex structures are exemplified by the second bump 304 and the third bump 305 shown in FIG. 18, both of which may be trapezoidal in a plane perpendicular to the display substrate. The shapes and sizes of the second bump 304 and the third bump 305 may be the same or different. However, this embodiment is not limited thereto.

In this example, the shapes and sizes of the second bump 304 and the third bump 305 may be the same. The second bump 304 is taken as an example for description below. A width of a surface (i.e., a top surface) of the second bump 304 on a side away from the base substrate 10 is less than a width of a surface (i.e., a bottom surface) on a side close to the base substrate, and the top surface and the bottom surface of the second bump 304 are connected by a slope surface. The gradient of the slope surface of the second bump 304 may be about 3° to 30°. For example, it may be about 5°. Orthographic projections of the top and bottom surfaces of the second bump 304 on the base substrate 10 may be rectangular, and a projection of the slope surface on the base substrate 10 may be a rectangular ring around the top surface. However, this embodiment is not limited thereto. For example, the projection of the top and bottom surfaces of the second bump on the base substrate may be circular or elliptical, and the projection of the slope surface on the base substrate may be a circular or elliptical ring around the top surface. In some examples, the gradients of the slopes around the top surface of the second bump may be the same, or may be partially the same. For example, the gradients of the slopes on the left and right sides of the top surface are the same and less than or greater than the gradients of the slopes on the upper and lower sides. However, this embodiment is not limited thereto.

In some examples, a distance between the top surface and the bottom surface of the second bump 301 in a plane perpendicular to the display substrate may be about 100 nm to 5 μm, for example, may be about 0.5 μm. Taking the rectangular orthographic projection of the second bump 304 on the base substrate 10 as an example, a second length of the orthographic projection of the second bump 304 on the base substrate 10 may be less than a length of the pixel opening formed on the pixel definition layer. For example, the second length may be about 5 μm to 20 μm; and for example, the second length may be about 10 μm. The second width of the orthographic projection of the second bump 304 on the base substrate 10 may be less than a width of the pixel opening formed on the pixel definition layer. For example, the second width may be about 3 to 15 μm; and for example, the second width may be about 8 μm.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 19:
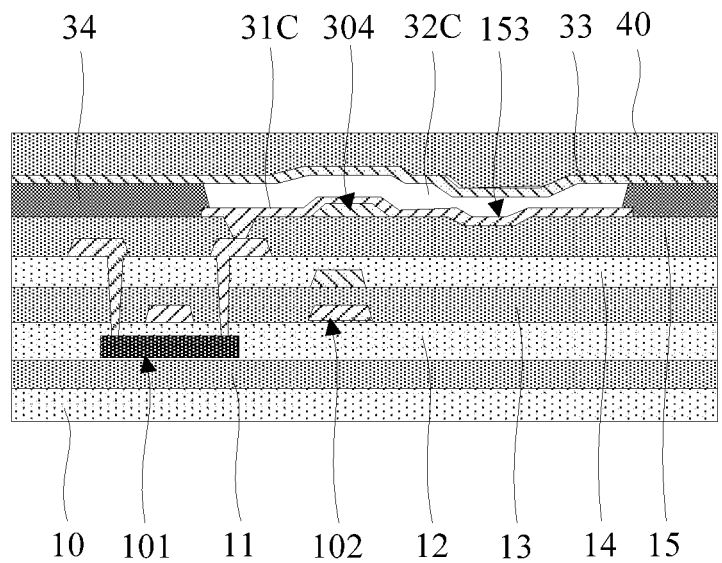
FIG. 19 is a schematic sectional view along a Q-Q direction in FIG. 17.

FIG. 19 is a schematic sectional view along a Q-Q direction in FIG. 17. In some exemplary embodiments, as shown in FIG. 19, the first structure includes a first planarization layer 15 and at least one convex structure located on a side of the first planarization layer 15 away from the base substrate 10. The first planarization layer 15 has a flat portion and at least one concave surface, and the convex structure of the first structure does not overlap with an orthographic projection of a concave surface of the first planarization layer 15 on the base substrate 10. An orthographic projection of the third anode 31C on the base substrate 10 includes orthographic projections of a convex structure and a concave surface of the first planarization layer 15 on the base substrate 10. The convex structure of the first structure may be made of a metallic material or a photosensitive organic material. In this example, the convex structure is exemplified by a second bump 304 shown in FIG. 19, and the concave surface of the first planarization layer 15 is exemplified by a second groove 153 shown in FIG. 19. In a plane perpendicular to the display substrate, the second bump 304 may be trapezoidal and the second groove 153 is formed on a surface of the first planarization layer 15 on a side away from the base substrate 10. Orthographic projections of the second bump 304 and the second groove 153 on the base substrate 10 do not overlap. The gradient of the slope surfaces of the second bump 304 and the second groove 153 may both be 3° to 30°. A distance (thickness) between the top surface and the bottom surface of the second bump 304 may be the same as a distance (depth) between the top surface and the bottom surface of the second groove 153. For example, the distance is about 100 nm to 5 μm. A length of the orthographic projection of the second bump 304 on the base substrate 10 may be less than a length of a pixel opening formed on the pixel definition layer. For example, the length is about 5 μm to 20 μm. A width of the orthographic projection of the second bump 304 on the base substrate 10 may be less than a width of the pixel opening formed on the pixel definition layer. For example, the width may be about 3 μm to 15 μm. A size of the orthographic projection of the second groove 153 on the base substrate 10 may be the same as a size of the orthographic projection of the second bump 304 on the base substrate 10. However, this embodiment is not limited thereto.

In this exemplary embodiment, a topography of the third anode is jointly adjusted by the concave and convex structures of the first planarization layer 15 so that the third anode forms a non-planar structure (for example, a convex structure corresponding to the shape and position of the second bump 304, and a concave structure corresponding to the shape and position of the second groove 153).

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 20:
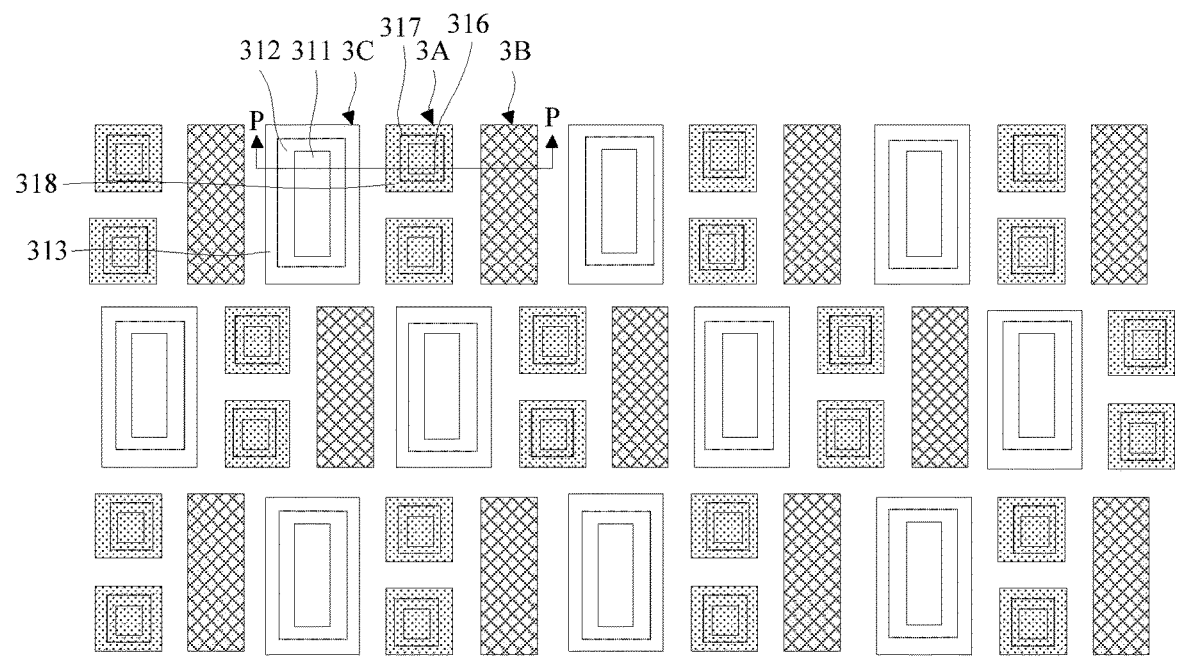
FIG. 20 is another schematic structural diagram of multiple sub-pixels of a display substrate according to at least one embodiment of the present disclosure.

FIG. 20 is another schematic structural diagram of multiple sub-pixels of a display substrate according to at least one embodiment of the present disclosure. FIG. 20 is another partial enlarged schematic diagram of a region S in FIG. 1.

In some exemplary embodiments, as shown in FIG. 20, the sub-pixel 3A of first color may be a green (G) sub-pixel, the sub-pixel 3B of second color may be a red (R) sub-pixel, and the sub-pixel 3C of third color may be a blue (B) sub-pixel.

In some exemplary embodiments, as shown in FIG. 20, on a plane parallel to the display substrate, a surface of the first electrode of the light-emitting element of the sub-pixel 3B of second color close to the organic light-emitting layer is planar. A side of the first electrode of the light-emitting element of the sub-pixel 3C of third color close to the base substrate is provided with a first structure. For example, the first structure includes a convex structure or a concave structure. The first structure provided on a side of the first electrode of the light-emitting element of the sub-pixel 3C of third color close to the base substrate includes a first planar region 311, a first slope region 312, and a second planar region 313. For example, the first structure may include a flat portion and a concave structure. An orthographic projection of the second planar region 313 on the base substrate does not overlap with orthographic projections of the first slope region 312 and the first planar region 311 on the base substrate. For example, the first structure may include a convex structure. The orthographic projection of the second planar region 313 on the base substrate may include the orthographic projections of the first slope region 312 and the first planar region 311 on the base substrate.

In some exemplary embodiments, as shown in FIG. 20, a side of the first electrode of the light-emitting element of the sub-pixel 3A of first color close to the base substrate is provided with a first structure. For example, the first structure includes a convex structure or a concave structure. The first structure provided on a side of the first electrode of the light-emitting element of the sub-pixel 3A of first color close to the base substrate includes a fourth planar region 316, a third slope region 317 and a fifth planar region 318. For example, the first structure may include a flat portion and a concave structure. An orthographic projection of the fifth planar region 318 on the base substrate does not overlap with orthographic projections of the third slope region 317 and the fourth planar region 316 on the base substrate. For example, the first structure may include a convex structure. The orthographic projection of the fifth planar region 318 on the base substrate may include the orthographic projections of the third slope region 317 and the fourth planar region 316 on the base substrate.

In some examples, a distance between the first planar region 311 and the base substrate is greater than a distance between the second planar region 313 and the base substrate, or a distance between the first planar region 311 and the base substrate is less than a distance between the second planar region 313 and the base substrate. A distance between the fourth planar region 316 and the base substrate is greater than a distance between the fifth planar region 318 and the base substrate, or a distance between the fourth planar region 316 and the base substrate is less than a distance between the fifth planar region 318 and the base substrate. A distance between the second planar region 313 and the base substrate is approximately equal to a distance between the fifth planar region 318 and the base substrate.

Figure 21:
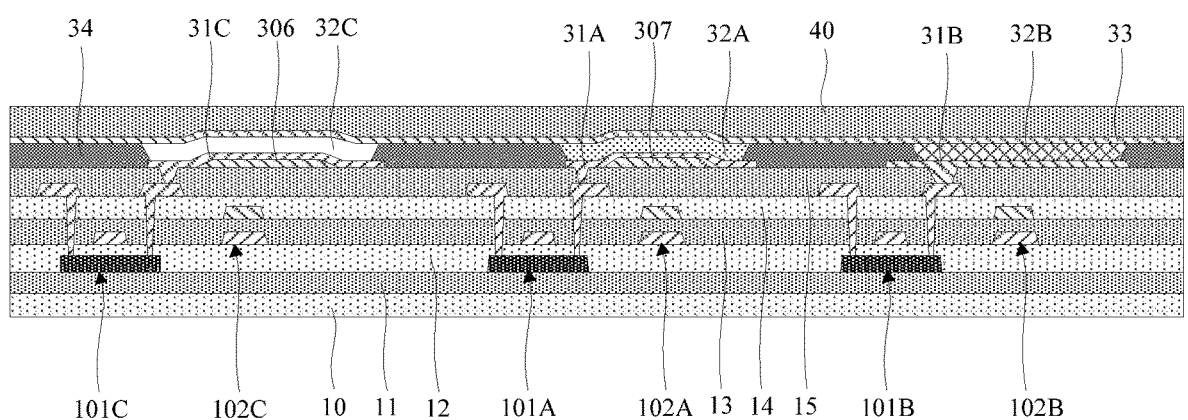
FIG. 21 is a schematic sectional view along a P-P direction in FIG. 19.

FIG. 21 is a schematic sectional view along a P-P direction in FIG. 20. In some exemplary embodiments, as shown in FIG. 21, on a plane perpendicular to the display substrate, the first structure includes a first planarization layer 15 located on a side of the drive structure layer away from the base substrate 10, and at least one convex structure located on a side of the first planarization layer 15 away from the base substrate 10. An orthographic projection of the light-emitting area of the sub-pixel of third color on the base substrate includes an orthographic projection of a convex structure on the base substrate 10, and an orthographic projection of the light-emitting area of the sub-pixel of first color on the base substrate 10 includes an orthographic projection of a convex structure on the base substrate 10. The first structure has multiple convex structures configured such that the sub-pixel of third color and the first electrode of the light-emitting element of the sub-pixel of first color form a non-planar structure. In this example, the two convex structures are exemplified by the fourth bump 306 and the fifth bump 307 shown in FIG. 21, which may both be trapezoidal in a plane perpendicular to the display substrate. The shapes and sizes of the fourth bump 306 and the fifth bump 307 may be the same or different. In some examples, the gradient of the slope surface of the fourth bump 306 may be different from the gradient of the slope surface of the fifth bump 307, thereby improving the matching consistency of the viewing angle characteristic of red, green and blue sub-pixels.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 22:
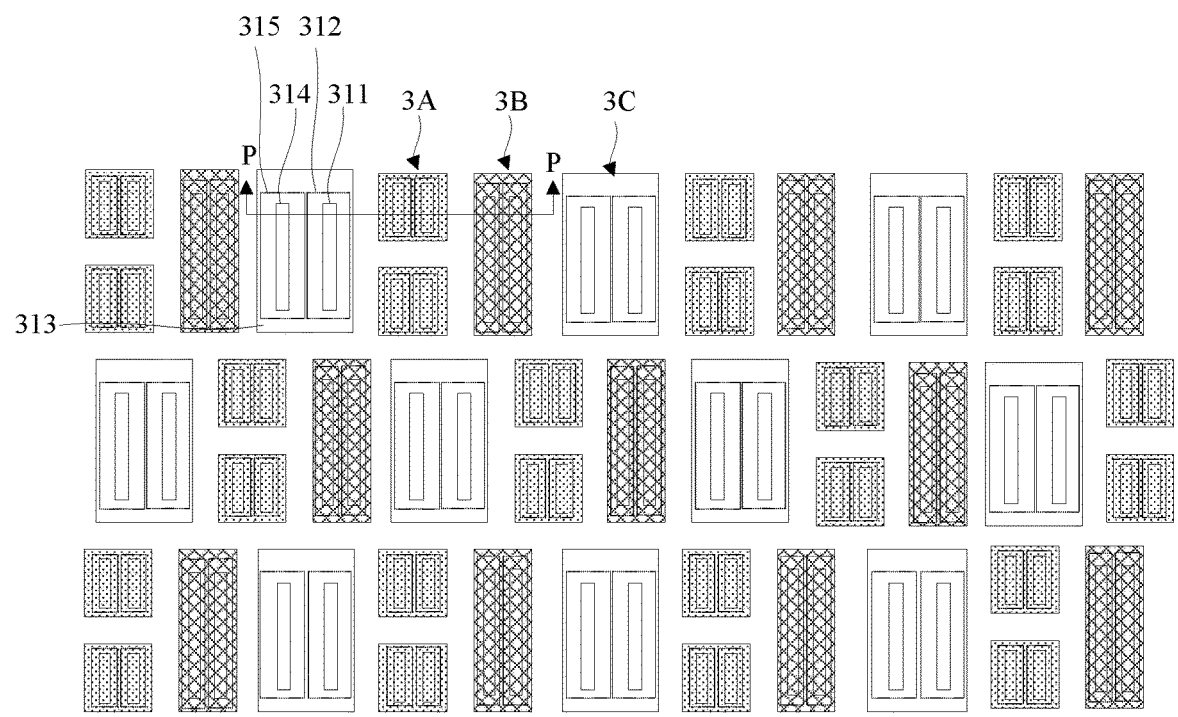
FIG. 22 is another schematic structural diagram of multiple sub-pixels of a display substrate according to at least one embodiment of the present disclosure.
Figure 23:
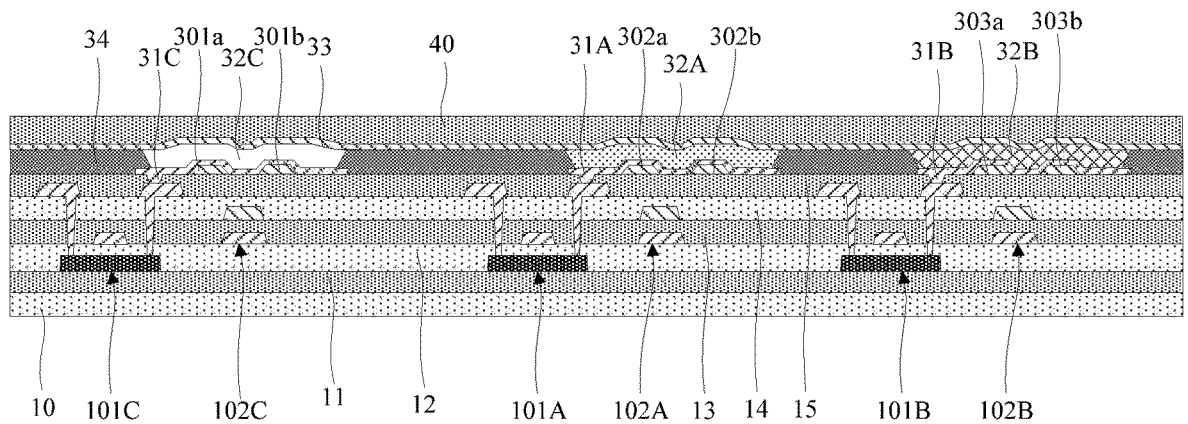
FIG. 23 is a schematic sectional view along a P-P direction in FIG. 22.

FIG. 22 is another schematic structural diagram of multiple sub-pixels of a display substrate according to at least one embodiment of the present disclosure. FIG. 22 is another partial enlarged schematic diagram of a region S in FIG. 1. FIG. 23 is a schematic sectional view along a P-P direction in FIG. 22.

In some exemplary embodiments, as shown in FIGS. 22 and 23, the sub-pixel 3A of first color may be a green sub-pixel, the sub-pixel 3B of second color may be a red sub-pixel, and the sub-pixel 3C of third color may be a blue sub-pixel.

In some exemplary embodiments, as shown in FIG. 22, in a plane parallel to the display substrate, a side of the first electrode 31C of the light-emitting element of the sub-pixel 3C of third color close to the base substrate is provided with a first structure having two convex structures in the light-emitting area corresponding to the sub-pixel 3C of third color, such as two bumps 301a and 301b shown in FIG. 23. A side of the first electrode 31B of the light-emitting element of the sub-pixel 3B of second color close to the base substrate is also provided with a first structure having two convex structures in the light-emitting area corresponding to the sub-pixel 3B of second color, such as two bumps 302a and 302b shown in FIG. 23. A side of the first electrode 31A of the light-emitting element of the sub-pixel 3A of first color close to the base substrate is also provided with a first structure having two convex structures in the light-emitting area corresponding to the sub-pixel 3A of first color, such as two bumps 303a and 303b shown in FIG. 23. Sections of the bumps 301a and 301b, 302a and 302b, and 303a and 303b may all be trapezoidal in a plane perpendicular to the display substrate. In this example, the shapes and sizes of the multiple bumps may be the same. However, this embodiment is not limited thereto. For example, the shapes and sizes of the multiple bumps may be different.

For the related description of the schematic planar structure of the first structure of this embodiment, reference may be made to the description of FIG. 17, which hence will not be repeated here. The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 24:
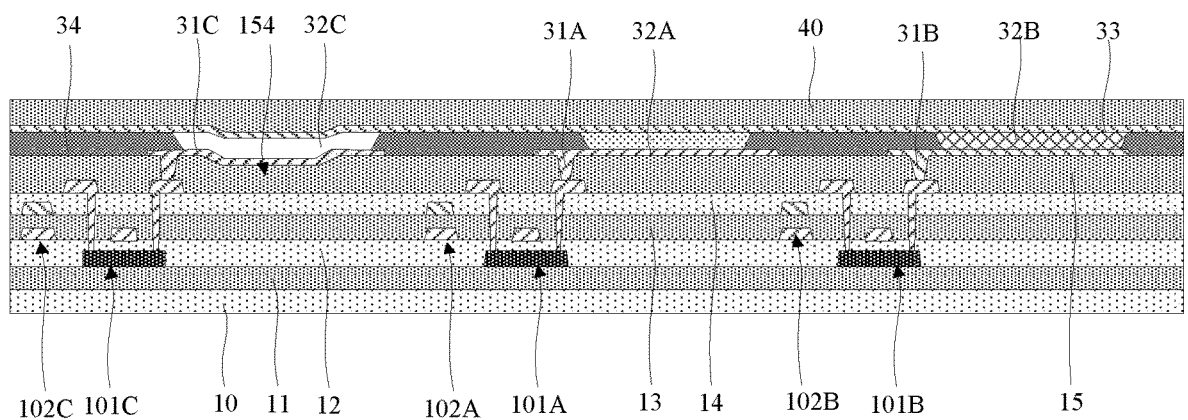
FIG. 24 is another schematic sectional view along a P-P direction in FIG. 2.

FIG. 24 is another schematic sectional view along a P-P direction in FIG. 2. In some exemplary embodiments, the sub-pixel 3A of first color may be a green sub-pixel, the sub-pixel 3B of second color may be a red sub-pixel, and the sub-pixel 3C of third color may be a blue sub-pixel. Taking a display substrate with a bottom emission structure as an example, the first electrode is a transparent anode, the second electrode is a reflective cathode, and the light reflected by the reflective cathode is emitted from a side close to the base substrate 10 through the transparent anode.

In some exemplary embodiments, as shown in FIG. 24, the first structure may be a first planarization layer 15. The first planarization layer 15 is located between the first electrode and the driving structure layer and may be made of an organic material and has a concave structure. In this example, the concave structure is exemplified by the third groove 154 shown in FIG. 21, which is formed on a surface of the first planarization layer 15 on a side away from the base substrate 10. The topography of the third anode 31C, the third organic light-emitting layer 32C, and the second electrode 33 may be sequentially adjusted by the concave structure formed on the first planarization layer 15, so that a surface of the third electrode on a side close to the third organic light-emitting layer 32C forms a non-planar structure (for example, a concave structure corresponding to the position and shape of the third groove 154). A surface of the second electrode 33 on a side close to the first organic light-emitting layer 32A and the second organic light-emitting layer 32B has a planar structure. In this exemplary embodiment, the topography of the first electrode of the sub-pixel of third color is adjusted using the first planarization layer 15 made of an organic material, and finally the topography of the second electrode of the sub-pixel of third color is adjusted, thereby adjusting the change of the light emission spectrum of the sub-pixel of third color with the viewing angle to improve the viewing angle deviation.

The structure of the display substrate of this exemplary embodiment is described only as an example. In some exemplary embodiments, the corresponding structure may be changed according to actual needs. For example, a first structure made of a metallic material may be provided between the first electrode and the driving structure layer to change the topography of the first electrode, the organic light-emitting layer, and the second electrode. However, the present disclosure is not limited thereto.

The structure of the display substrate in this exemplary embodiment is similar to the corresponding structure described in the previous embodiment, which hence will not be repeated here. The structure (or method) shown in this embodiment may be combined with structures (or methods) shown in other embodiments as appropriate.

Figure 25:
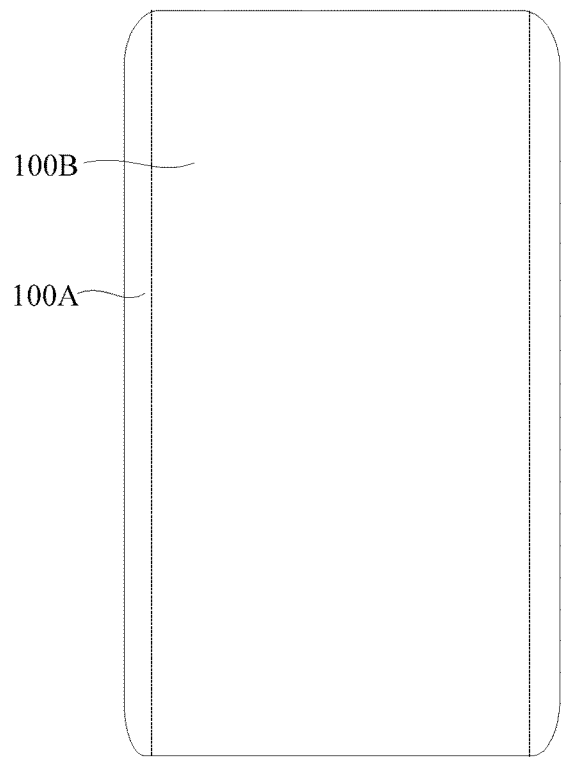
FIG. 25 is a schematic diagram of a display substrate according to at least one embodiment of the present disclosure.

FIG. 25 is a schematic diagram of a display substrate according to at least one embodiment of the present disclosure. As shown in FIG. 25, the display substrate includes a first display area 100A and a second display area 100B, wherein the first display area 100A is located on opposite sides of the second display area 100B and communicates with the second display area 100B. The first display area 100A is a curved display area and the second display area 100B is a flat surface display area. In some examples, a bend dividing line is used as a dividing line between the first display area 100A and the second display area 100B. The plane in which the second display area 100B is located may be parallel to the horizontal plane and an tangent of the plane in which the first display area 100A is located is not parallel to the horizontal plane. However, this embodiment is not limited thereto.

In this exemplary embodiment, the structure of the sub-pixels within the first display area 100A may be as shown in the above-described embodiments. For example, the reflective electrode of the light-emitting element of the sub-pixel of the target color in the first display area 100A is provided with a first structure on a side close to the base substrate, and the reflective electrodes of the light-emitting elements of the sub-pixels of all colors in the first display area 100A are provided with a first structure on a side close to the base substrate. A surface of the first structure close to the first electrode is uneven. The reflective electrodes of the light-emitting elements of the sub-pixels of different colors in the second display area 100B may all have a planar structure. In some examples, the arrangement density of the convex structure of the first structure increases in a direction away from the second display area 100B within the first display area 100A. In the first display area 100A close to the second display area 100B, a convex structure may be provided on a side where the first electrodes of the light-emitting elements of fewer sub-pixels are close to the base substrate, and in the first display area 100A far from the second display area 100B, a convex structure may be provided on a side where the first electrodes of the light-emitting elements of more sub-pixels are close to the base substrate. However, this embodiment is not limited thereto.

In this exemplary embodiment, only the sub-pixels of the curved display area of the display substrate are adjusted, without changing the structure of sub-pixels in the flat surface display area, so that the corresponding color cast adjustment may be realized for the curved display area, while the normal display effect may be maintained for the flat surface display area, and the situation that the front brightness of the flat surface display area becomes low due to the non-flat design of the reflective electrode is avoided.

At least one embodiment of the present disclosure further provides a manufacturing method of a display substrate, including the following steps: forming multiple sub-pixels of different colors in a first display area of a base substrate. At least one sub-pixel of the multiple sub-pixels of different colors includes a light-emitting element and a pixel driving circuit electrically connected to the light-emitting element. The light-emitting element includes a first electrode, a second electrode, and an organic light-emitting layer provided between the first electrode and the second electrode. The first electrode is a reflective electrode and is electrically connected to the pixel driving circuit. A first structure is formed on a side of the first electrode of the light-emitting element of a sub-pixel of at least one target color close to the base substrate. A surface of the first structure close to the first electrode is uneven.

In some exemplary embodiments, the step of forming the multiple sub-pixels of different colors in the first display area of the base substrate includes forming multiple pixel driving circuits on the base substrate; and forming a first structure on a side of a first electrode of a light-emitting element of a sub-pixel of at least one target color close to the base substrate, wherein a surface of the first structure close to the first electrode is uneven. The first structure includes at least one convex structure. An orthographic projection of the first electrode on the base substrate includes an orthographic projection of the at least one convex structure on the base substrate.

In some exemplary embodiments, the step of forming the first structure on the side of the first electrode of the light-emitting element of the sub-pixel of at least one target color close to the base substrate includes at least one of the following: etching a metal film using a wet etching process to form a convex structure of the first structure; and using a photosensitive organic material for exposure and development to form a convex structure of the first structure.

The manufacturing method in this embodiment may refer to the descriptions in the above-mentioned embodiments, and thus will not be repeated herein.

Figure 26:
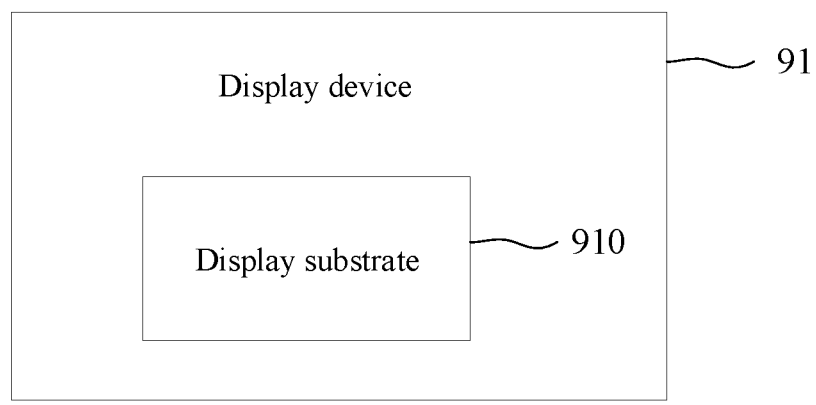
FIG. 26 is a schematic diagram of a display device according to at least one embodiment of the present disclosure.

FIG. 26 is a schematic diagram of a display device according to at least one embodiment of the present disclosure. As shown in FIG. 26, this embodiment provides a display device 91, including a display substrate 910. The display substrate 910 is the display substrate provided in the above-mentioned embodiments. Herein, the display substrate 910 may be an OLED display substrate. The display device 91 may be any product or component with a display function, such as a mobile phone, a tablet computer, a television, a display, a notebook computer, a digital photo frame, a navigator, etc. However, this embodiment is not limited thereto.

The drawings of the present disclosure only involve the structures involved in the present disclosure, and the other structures may refer to conventional designs. The embodiments in the present disclosure, i.e., the features in the embodiments, may be combined with each other to obtain new embodiments if there is no conflict.

Those of ordinary skills in the art should know that modifications or equivalent replacements may be made to the technical solutions of the present disclosure without departing from the spirit and scope of the technical solutions of the present disclosure, and the modifications or equivalent replacements shall all fall within the scope of the claims of the present disclosure.

The invention claimed is:

1. A display substrate, comprising: a base substrate comprising a first display area provided with multiple sub-pixels of different colors; wherein
at least one sub-pixel of the multiple sub-pixels of different colors comprises a light-emitting element and a pixel driving circuit electrically connected to the light-emitting element;
the light-emitting element comprises a first electrode, a second electrode, and an organic light-emitting layer provided between the first electrode and the second electrode, the first electrode being electrically connected to the pixel driving circuit; and
a first structure is provided on a side of the first electrode of the light-emitting element of a sub-pixel of at least one target color close to the base substrate, a surface of the first structure close to the first electrode being uneven; wherein
wherein the first structure comprises at least one convex structure, the at least one convex structure is made of a metallic material, and the first structure further comprises a second insulating layer between the at least one convex structure and the first electrode.

2. The display substrate according to claim 1, wherein an orthographic projection of the first electrode on the base substrate comprises an orthographic projection of the at least one convex structure on the base substrate.

3. The display substrate according to claim 2, wherein the first structure further comprises a first insulating layer located on a side of the at least one convex structure close to the base substrate, and an orthographic projection of the first insulating layer on the base substrate comprises the orthographic projection of the first electrode on the base substrate.

4. The display substrate according to claim 3, wherein a surface of the first insulating layer close to the convex structure is flat.

5. The display substrate according to claim 3, wherein a surface of the first insulating layer close to the convex structure has a concave surface, and an orthographic projection of the convex structure on the base substrate does not overlap with an orthographic projection of the concave surface of the first insulating layer on the base substrate.

6. The display substrate according to claim 1, wherein
the first structure has a flat portion and at least one non-flat portion; an orthographic projection of the flat portion on the base substrate does not overlap with an orthographic projection of the at least one non-flat portion on the base substrate; and
an orthographic projection of the first electrode on the base substrate comprises an orthographic projection of the at least one non-flat portion on the base substrate.

7. The display substrate according to claim 6, wherein the at least one non-flat portion comprises at least one of a convex structure and a concave structure; and a thickness of the first structure at the convex structure is greater than a thickness at the flat portion, and a thickness of the first structure at the concave structure is less than a thickness at the flat portion.

8. The display substrate according to claim 2, wherein in a plane perpendicular to the base substrate, the convex structure comprises a top surface and a slope connecting to the top surface, and an angle between a tangent of the slope surface and a plane parallel to the base substrate is about 3° to 30°.

9. The display substrate according to claim 2, wherein the convex structure has a height of about 100 nm to 5 μm.

10. The display substrate according to claim 2, wherein in a plane parallel to the base substrate, a length of the convex structure in a first direction is less than a length of the corresponding sub-pixel in the first direction, and a length of the convex structure in a second direction is less than a length of the corresponding sub-pixel in the second direction; and
the first direction crosses the second direction.

11. The display substrate according to claim 2, wherein in a plane parallel to the base substrate, the convex structure has a width of about 500 nm to 15 μm, and a non-planar structure formed by the first electrode based on the convex structure has a width of about 1 μm to 25 μm.

12. The display substrate according to claim 1, wherein a shape of the non-planar structure formed by the first electrode based on the first structure is different from a shape of the base substrate; and/or
the first electrode is a reflective electrode; and/or
the sub-pixel of the at least one target color comprises at least one of a blue sub-pixel, a green sub-pixel, and a red sub-pixel.

13. The display substrate according to claim 6, wherein the pixel driving circuit comprises an active layer, a first gate metal layer, a second gate metal layer, a first source-drain metal layer, and a second source-drain metal layer that are sequentially provided on the base substrate, the first structure is provided between the second source-drain metal layer and the light-emitting element, and a thickness of the first structure is less than or equal to 2 μm;

the first source-drain metal layer and the second source-drain metal layer satisfy at least one of the following:
an overlapping area of orthographic projections of the first source-drain metal layer and the second source-drain metal layer of a pixel driving circuit of a sub-pixel of the at least one target color on the base substrate is greater than an overlapping area of orthographic projections of the first source-drain metal layer and the second source-drain metal layer of a pixel driving circuit of a sub-pixel of a color other than the at least one target color on the base substrate; and
a thickness of the second source-drain metal layer of the pixel driving circuit of the sub-pixel of the at least one target color is greater than a thickness of the second source-drain metal layer of the pixel driving circuit of the sub-pixel of the color other than the at least one target color.

14. The display substrate according to claim 1, wherein the base substrate further comprises a second display area; and the second display area is a flat surface display area, and the first display area is a curved display area or a bent display area around the second display area.

15. The display substrate according to claim 14, wherein second electrodes of the first display area and the second display area are integrated, and insulating layers of the first display area and the second display area are integrated.

16. A display device, comprising the display substrate according to claim 1.

17. A manufacturing method of a display substrate, comprising:
forming multiple sub-pixels of different colors in a first display area of a base substrate; wherein at least one sub-pixel of the multiple sub-pixels of different colors comprises a light-emitting element and a pixel driving circuit electrically connected to the light-emitting element; and the light-emitting element comprises a first electrode, a second electrode and an organic light-emitting layer provided between the first electrode and the second electrode, the first electrode being electrically connected to the pixel driving circuit; and
forming a first structure on a side of the first electrode of the light-emitting element of a sub-pixel of at least one target color close to the base substrate, a surface of the first structure close to the first electrode being uneven; wherein
wherein the first structure comprises at least one convex structure, the at least one convex structure is made of a metallic material, and the first structure further comprises a second insulating layer between the at least one convex structure and the first electrode.

18. The manufacturing method according to claim 17, wherein the step of forming the multiple sub-pixels of different colors in the first display area of the base substrate comprises:
forming multiple pixel driving units on the base substrate; and
forming a first structure on a side of the first electrode of the light-emitting element of a sub-pixel of at least one target color close to the base substrate, a surface of the first structure close to the first electrode being uneven;
wherein an orthographic projection of the first electrode on the base substrate comprises an orthographic projection of the at least one convex structure on the base substrate.

19. The manufacturing method according to claim 18, wherein the step of forming the first structure on the side of the first electrode of the light-emitting element of the sub-pixel of at least one target color close to the base substrate comprises at least one of the following steps:
etching a metal film by wet etching process to form a convex structure of the first structure; and
using a photosensitive organic material for exposure and development to form a convex structure of the first structure.

* * * * *